United States Patent
Ware

(10) Patent No.: US 11,657,006 B2
(45) Date of Patent: *May 23, 2023

(54) LOW LATENCY MEMORY ACCESS

(71) Applicant: Rambus Inc., San Jose, CA (US)

(72) Inventor: Frederick A. Ware, Los Altos Hills, CA (US)

(73) Assignee: Rambus Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/461,064

(22) Filed: Aug. 30, 2021

(65) Prior Publication Data

US 2022/0043758 A1 Feb. 10, 2022

Related U.S. Application Data

(63) Continuation of application No. 16/418,553, filed on May 21, 2019, now Pat. No. 11,132,307.

(60) Provisional application No. 62/676,670, filed on May 25, 2018.

(51) Int. Cl.
*G06F 13/16* (2006.01)

(52) U.S. Cl.
CPC ...... *G06F 13/1615* (2013.01); *G06F 13/1689* (2013.01)

(58) Field of Classification Search
CPC .......................... G06F 13/1615; G06F 13/1689
See application file for complete search history.

(56) References Cited

U.S. PATENT DOCUMENTS

| | | |
|---|---|---|
| 4,615,017 A | 9/1986 | Finlay et al. |
| 6,209,071 B1 | 3/2001 | Barth et al. |
| 6,496,445 B2 | 12/2002 | Lee |
| 6,567,321 B2 | 5/2003 | Lee |
| 6,650,593 B2 | 11/2003 | Takemae |
| 6,678,832 B1 | 1/2004 | Gotanda |
| 6,717,884 B2 | 4/2004 | Kim |
| 7,057,966 B2 | 6/2006 | Kang et al. |
| 7,142,467 B2 | 11/2006 | Chun |
| 7,394,720 B2 | 7/2008 | Kim et al. |
| 7,450,463 B2 | 11/2008 | Lee |
| 7,453,753 B2 | 11/2008 | Chun |
| 7,639,764 B2 | 12/2009 | Cohen |
| 7,733,738 B2 | 6/2010 | Yoon |
| 7,920,431 B2 | 4/2011 | Nobunaga et al. |
| 7,940,543 B2 | 5/2011 | Chang et al. |
| 8,356,127 B2 | 1/2013 | Hampel |
| 8,482,996 B2 | 7/2013 | Oh |
| 8,504,868 B2 | 8/2013 | Bohno |

(Continued)

*Primary Examiner* — Vanthu T Nguyen
(74) *Attorney, Agent, or Firm* — The Neudeck Law Firm, LLC

(57) ABSTRACT

A memory device includes receivers that use CMOS signaling levels (or other relatively large signal swing levels) on its command/address and data interfaces. The memory device also includes an asynchronous timing input that causes the reception of command and address information from the CMOS level receivers to be decoded and forwarded to the memory core (which is self-timed) without the need for a clock signal on the memory device's primary clock input. Thus, an activate row command can be received and initiated by the memory core before the memory device has finished exiting the low power state. Because the row operation is begun before the exit wait time has elapsed, the latency of one or more accesses (or other operations) following the exit from the low power state is reduced.

20 Claims, 16 Drawing Sheets

(56) References Cited

U.S. PATENT DOCUMENTS

| | | |
|---|---|---|
| 8,634,241 B2 | 1/2014 | Lee et al. |
| 8,760,945 B2 | 6/2014 | Jeon |
| 9,032,279 B2 | 5/2015 | Song |
| 9,159,438 B2 | 10/2015 | Im |

LOW LATENCY MEMORY ACCESS

DETAILED DESCRIPTION OF THE EMBODIMENTS

In an embodiment, a memory device (e.g., Dynamic Random Access Memory-DRAM, flash memory, etc.) may be placed into a power conservation state. In this power conservation state, the interfaces (e.g., command/address, data, etc.) are shut down and the clock signal is stopped. While in this mode, the current required by the memory device is very low (e.g., ~3 mA.) The memory device includes receivers that use Complementary metal-oxide-semiconductor (CMOS) signaling levels on its command/address and data interfaces (e.g., a high threshold voltage of 2.0V and a low threshold voltage of 0.8V—or other relatively large signal swing levels.) The memory device also includes an asynchronous timing input that causes the transfer of command and address information from the CMOS level receivers to the memory core (which is self-timed) without the need for a clock signal on the memory device's primary clock input. Thus, an activate row command can be received and initiated by the memory core before the memory device has finished exiting the low power state. Because the row operation is begun before the exit wait time has elapsed, the latency of one or more accesses (or other operations) following the exit from the low power state is reduced.

Figure 1:
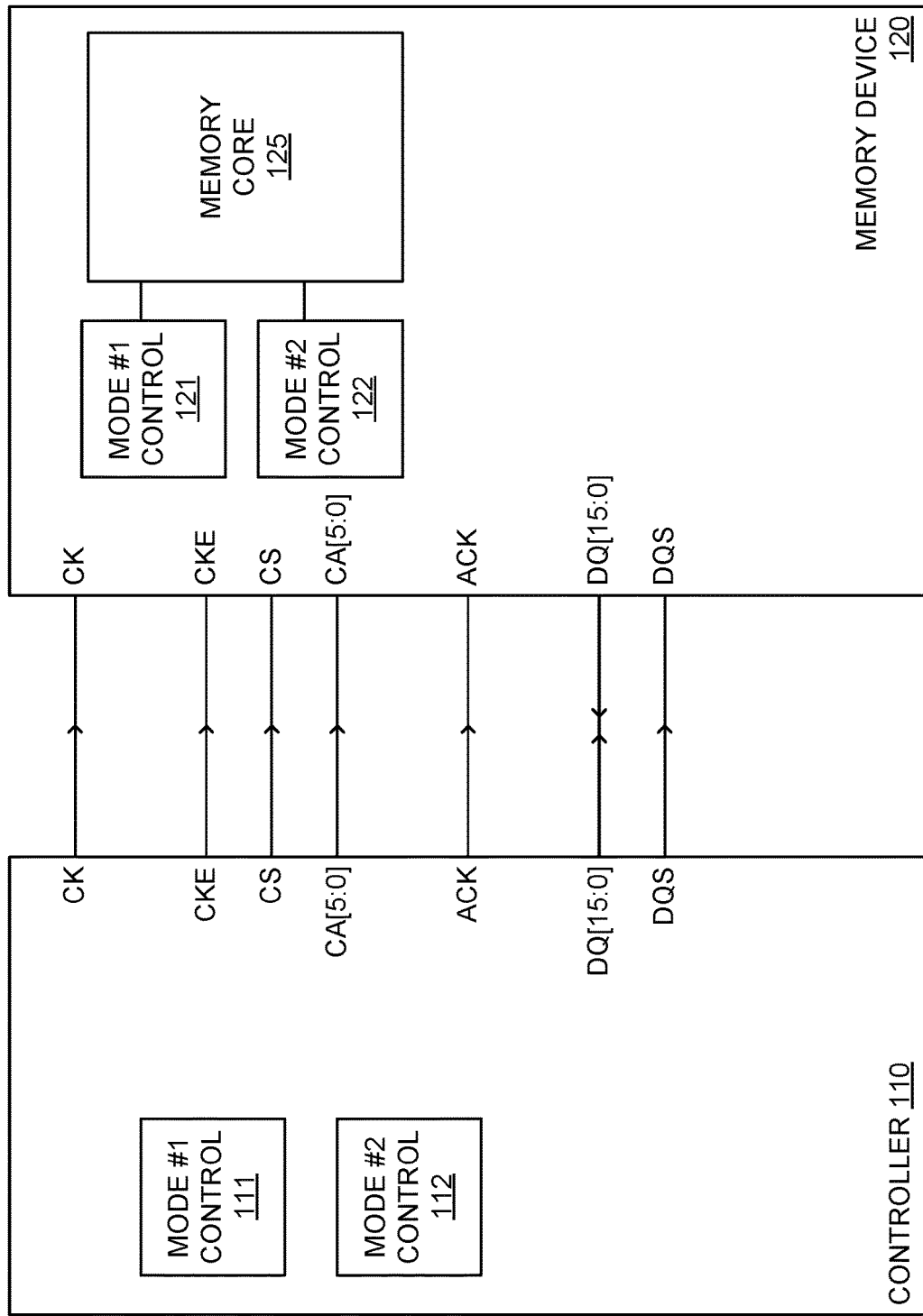
FIG. 1 is a block diagram illustrating a memory system.

FIG. 1 is a block diagram illustrating a memory system. In FIG. 1, memory system 100 includes controller 110 and memory device 120. Memory device 120 includes memory core 125, mode #1 control circuitry 121, and mode #2 control circuitry 122. Controller 110 includes mode #1 control circuitry 111 and mode #2 control circuitry 112. It should be understood that the separation of mode #1 control circuitry 121 and mode #2 control circuitry into separate blocks is merely for illustration. The functions provided by mode #1 circuitry 121 and mode #2 control circuitry may be provided by a single circuit block. Likewise, mode #1 control circuitry 111 and mode #2 control circuitry 112 may be provided by a single circuit block.

Controller 110 is operatively coupled to memory device 120. In particular, in FIG. 1, controller 110 provides or communicates with memory device 120 using at least the following signals: one or more clock (e.g., CK) signals, one or more clock enable (e.g., CKE) signals, one or more chip select (e.g., CS) signals, one or more command/address signals (e.g., CA[0:5]), one or more asynchronous timing (e.g., ACK) signals, one or more bidirectional data (e.g., DQ[15:0]) signals, and one or more data strobe (e.g., DQS) signals.

It should be noted that in the discussions herein and the Figures, the set of CA signals (and interfaces) may be denoted CA[5:0] possibly implying that there are exactly six CA signals. However, this is merely exemplary for the sake of the disclosures given herein. Other numbers of CA signals, interfaces, and links are contemplated. Likewise, DQ[15:0] is merely exemplary and other numbers of DQ signals, interfaces, and links are also contemplated.

In an embodiment, memory device 120 can be operated in at least two modes. A first mode (e.g., mode #1) is a high performance, higher power mode. In this mode, commands and addresses are communicated synchronously to memory device 120 on at least the CA interface. The clock enable (CKE) and chip select (CS) signals are also communicated synchronously to memory device 120. The timing reference that synchronizes the sampling (or transfer) of these signals is a periodic (e.g., at an operating frequency) clock signal (CK). Likewise, data is communicated to/from memory device 120 synchronously on at least the data interface DQ. The timing reference that synchronizes the sampling or transmission of data on the DQ interface are the data strobe signal(s) DQS.

A second mode that memory device 120 may be operated (e.g., mode #2) is a power conservation mode. In this mode, the synchronous operation of the CA and DQ interfaces is shut down. The synchronous timing reference CK is also halted (i.e. it is no longer periodically switching states). Also, in this mode, one or more commands and addresses may be communicated asynchronously to memory device 120 on the CA and DQ interfaces. The clock enable (CKE) and a chip select (CS) signals are also asynchronously sampled by memory device 120. The timing reference that controls the sampling (or transfer) of these signals is an asynchronous timing signal (ACK). Thus, commands and addresses may be communicated to memory device 120 in this mode via the CA and DQ interfaces using ACK to provide timing. The signal supplied to the CA and DQ interfaces by controller 110 may have different logic thresholds than the signals communicated in the first mode. For example, signals communicated via the CA and DQ interfaces during the high-speed high-power operation mode may have very small signal swings (e.g., 1.2 V). However, the signals communicated via the CA and DQ interfaces during the power conservation mode may have full CMOS voltage swings (e.g., 3.0, or 3.3V p-p).

A selected transition (e.g., rising from low to high or falling from high to low) of ACK determines when the command and address information on the CA and DQ links is sampled by memory device 120. Memory device 120 decodes the sampled signals to generate control signals that are applied to memory core 125 to cause an access. Thus, in response to the applied control signals, memory core 125 can at least initiate a row activate operation at the address specified by the sampled command and address information from the CA and/or DQ interfaces.

In an embodiment, the asynchronous timing reference may be received on its own interface/pin/pad. In an embodiment the asynchronous timing reference may be multiplexed on an interface/pin/pad that has a different function when memory device 120 is in the high-power mode. For example, the clock enable (CKE) input may function as a clock enable signal input while memory device 120 is in the high-power mode, and then function as the asynchronous timing reference while memory device 120 is in the power conservation mode. Accordingly, references to ACK herein should also be construed to include receiving the asynchronous timing reference via a non-dedicated (e.g., CKE) input to memory device 120.

In an embodiment, on a transition (e.g., rising) of the asynchronous timing reference (ACK), a row activate address and control is transferred to memory core 125. This activate operation occurs in parallel with memory device 120 being controlled to exit the power conservation mode. Once memory device 120 has exited the power conservation mode, controller 110 may complete a column operation using the high-power synchronous modes of interfaces CA and DQ. Thus, it should be understood that memory device 120 may be controlled to start an access operation while still in the power conservation mode and then complete the operation while in the high-power mode. In other words, while memory device 120 in the power conservation mode and is not receiving periodic clock signals for synchronizing command/address/and data transfers, a row operation may be initiated by a strobe signal on the asynchronous timing reference (ACK). Memory device 120 receives the information it needs to initiate a row operation using both the CA and DQ interfaces, which sample and forward the information presented to them in response to the strobe signal on the asynchronous timing reference ACK. Because memory core 125 is self-timed. It can perform the row operation without the use of synchronous timing reference CK.

In an embodiment, memory device 120 may be controlled by controller 110 to perform other types of operations based on the information received on the CA and/or DQ interfaces in response to the asynchronous timing reference ACK. For example, one or more of following operations may be performed by memory device 120: (1) memory device 120 may refresh all banks that are at a refresh counter row address; (2) memory device 120 may refresh one bank specified by the refresh counter bank/row address; (3) memory device 120 may refresh all banks that are at the row address specified by the signals at the CA and/or DQ interfaces; (4) memory device 120 may refresh one bank specified by the signals at the CA and DQ interfaces; (5) memory device 120 may refresh one bank specified by the signals at the CA and/or DQ interfaces and refresh counter row address; and, (6) a credit/debit counter may be used to conditionally refresh at the refresh counter bank/row address if the refresh timer has elapsed.

An example of a single refresh followed by a column access may proceed as follows: (1) a refresh command and address is transmitted by controller 110 to memory device 120 on the CA and DQ interfaces; (2) on receiving the selected transition of ACK (e.g., transmitted by controller 110) memory device 120 performs an activate/precharge of the bank/row specified by the command received at the CA and DQ interfaces; (3) a row activate command and address for a read or write is transmitted by controller 110 to memory device 120 on the CA and DQ interfaces; (4) on a second edge of ACK (e.g., transmitted by controller 110) the row activate address for a different bank (i.e., different from the bank specified previously) is used to access the memory core 125. Note that this second activate command may be performed in parallel with memory device 120 being controlled to exit the power conservation mode. One or more column operations (e.g., read or write) associated with the second activate command may be completed in high-power mode using the synchronous functionality of the CA and DQ interfaces.

An example of a conditional refresh followed by a column access may proceed as follows: (1) a self-refresh command and address is transmitted by controller 110 to memory device 120 on the CA and DQ interfaces; (2) on receiving the selected transition of ACK (e.g., transmitted by controller 110) memory device 120 will perform an activate/precharge of the bank/row specified by the command received at the CA and DQ interfaces if a credit/debit counter (internal to memory device 120—not shown in FIG. 1) indicates a refresh should be performed—this optimizes the refresh rate for the temperature of memory device 120; (3a) after waiting a minimum of a period of time that allows for the refresh operation and row precharge operation to (conditionally) be performed, and if a read or write is to be performed, a row activate command and address for a read or write may be transmitted by controller 110 to memory device 120 on the CA and DQ interfaces; (3b) alternately, if no reads/writes are to be performed during the current refresh interval, controller 110 may proceed to step #1 at the end of the current refresh interval; (4) if a read or write is to be performed, on a second edge of ACK (e.g., transmitted by controller 110) the row activate address for a different bank (i.e., different from the bank specified previously) is transferred to memory core 125. Note that this second activate command may be performed in parallel with memory device 120 being controlled to exit the power conservation mode. One or more column operations associated the second activate command may be completed in high-power mode using the synchronous functionality of the CA and DQ interfaces.

Figure 2:
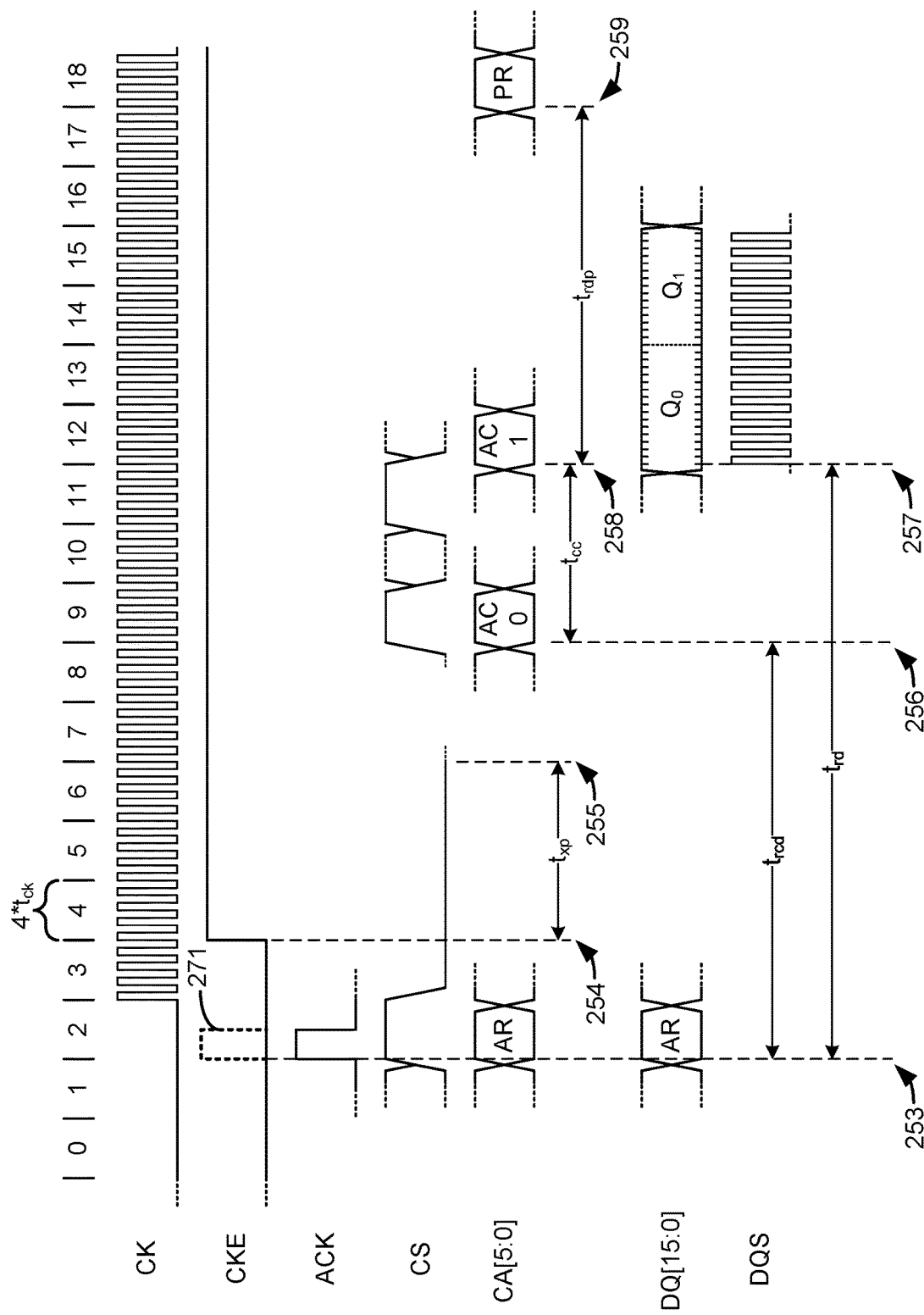
FIG. 2 is a timing diagram illustrating an example low latency access.

FIG. 2 is a timing diagram illustrating an example low latency access. The steps and timing illustrated in FIG. 2 may be performed by one or more elements of at least memory system 100. At the start of the timing diagram of FIG. 2, the memory device (e.g., memory device 120) has been controlled to operate in the power conservation mode: the synchronous interface clocks (CK, DQS) are inactive and thus not switching, the clock enable signal (CKE) is in an inactive state, the asynchronous timing signal (ACK) is in an inactive state, the command address (CA), data (DQ), and chip select (CS) signals are in unknown or 'don't care' states.

A setup time before ACK is asserted, the chip select signal is brought to an active state (e.g., by controller 110), first activate row information (e.g., a command opcode, a bank/row address, partial command opcode, and/or partial address) is provided (e.g., by controller 110) to the CA interface, and second activate row information (e.g., a bank/row address, partial command opcode, and/or partial address) is provided (e.g., by controller 110) to the DQ interface. ACK is then transitioned (at time 253). This latches (samples) the first activate row information and second activate row information and forwards this information to access a memory core (e.g., memory core 125). The memory core then activates the bank/row associated with the first activate row information and second activate row information.

Note that in an embodiment, the asynchronous timing signal may be received via the clock enable interface. This is shown in FIG. 2 by pulse 271 on CKE. If the asynchronous timing signal may be received via the clock enable interface, the memory device may not include a dedicated ACK pin/pad/interface. In another embodiment, a mode or other control (e.g., control register value) may specify whether the asynchronous timing signal is received via a dedicated ACK interface or whether the asynchronous timing signal is received via the clock enable interface.

In FIG. 2, concurrently with the memory device performing the specified row activation, the memory device is brought out of the power conservation mode (e.g., by controller 110.) The synchronous timing reference signal CK is activated and begins periodically switching states at a frequency. After CK has stabilized, clock enable is asserted at time 254. This starts the processes internal to the memory device to exit the power conservation mode.

A specified interval (i.e., $t_{XP}$) after the assertion of the clock enable signal (and while CK is running and stable), at time 255, the memory device has entered the high-power mode. At time 256, which is a specified row to column delay ($t_{RCD}$) after the asynchronous activate row command was forwarded to the memory core, a first column access command is synchronously received (i.e., synchronized by CK) via the CA interface.

At time 257, which is a specified row to data delay ($t_{RD}$) after the asynchronous activate row command was forwarded to the memory core, data ($Q_0$) begins to be synchronously (i.e., synchronized by DQS) received (for a write) or transmitted (for a read) via the DQ interface. At time 258, which is a specified column access to column access ($t_{CC}$) after the first column access command, a second column access command is synchronously received (i.e., synchronized by CK) via the CA interface. In response to the second column access command, data ($Q_1$) is to be synchronously (i.e., synchronized by DQS) received or transmitted via the DQ interface subsequently to the data corresponding to the first column access command. At time 259, which is a specified column access to precharge delay ($t_{RDP}$) after the second column access command, a precharge command is synchronously received (i.e., synchronized by CK) via the CA interface.

Figure 3:
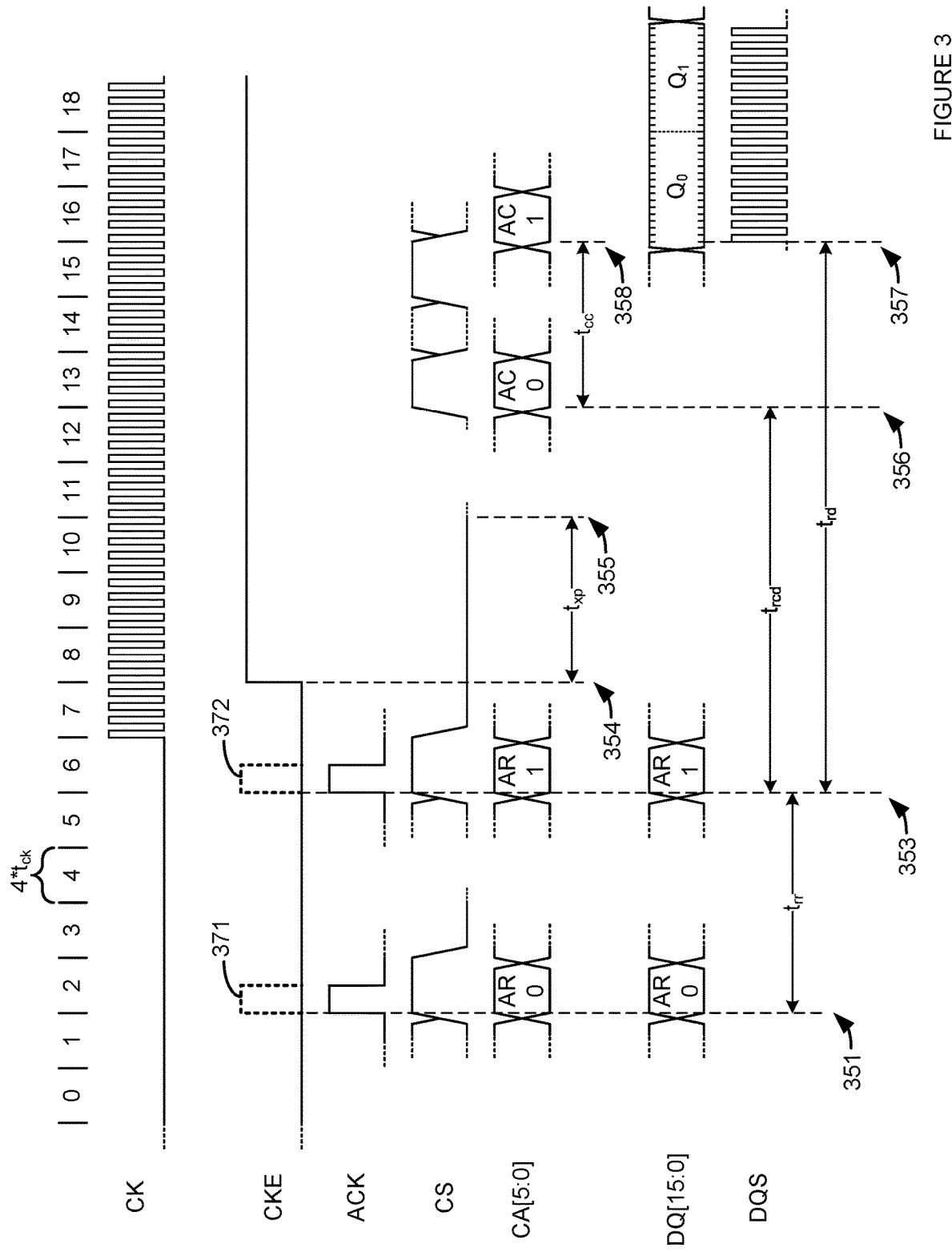
FIG. 3 is a timing diagram illustrating an example deterministic asynchronous refresh followed by a low latency access.

FIG. 3 is a timing diagram illustrating an example deterministic asynchronous refresh followed by a low latency access. The steps and timing illustrated in FIG. 3 may be performed by at least one or more elements of memory system 100. At the start of the timing diagram of FIG. 3, the memory device (e.g., memory device 120) has been controlled to operate in the power conservation mode: the synchronous interface clocks (CK, DQS) are inactive and thus not periodically switching, the clock enable signal (CKE) is in an inactive state, the asynchronous timing signal (ACK) is in an inactive state, the command address (CA), data (DQ), and chip select (CS) signals are in unknown or 'don't care' states.

A setup time before ACK is first asserted in FIG. 3, the chip select signal is brought to an active state (e.g., by controller 110), first activate row information (e.g., a command opcode, a bank/row address, partial command opcode, and/or partial address) is provided (e.g., by controller 110) to the CA interface, and second activate row information (e.g., a command opcode, a bank/row address, partial command opcode, and/or partial address) is provided (e.g., by controller 110) to the DQ interface. ACK is then asserted (at time 351). This latches (samples) the first activate row information and second activate row information and forwards this information to a memory core (e.g., memory core 125). The memory core then activates the bank/row associated with the first activate row information and second activate row information.

Note that in an embodiment, the asynchronous timing signal may be received via the clock enable interface. This is shown in FIG. 3 by pulse 371 on CKE. If the asynchronous timing signal may be received via the clock enable interface, the memory device may not include a dedicated ACK pin/pad/interface. In another embodiment, a mode or other control (e.g., control register value) may specify whether the asynchronous timing signal is received via a dedicated ACK interface or whether the asynchronous timing signal is received via the clock enable interface.

A setup interval before time 353, the chip select signal is brought to (or remains at) an active state (e.g., by controller 110), third activate row information (e.g., a second command opcode, a second bank/row address, second partial command opcode, and/or second partial address) is provided (e.g., by controller 110) to the CA interface, and fourth activate row information (e.g., a second command opcode, a second bank/row address, second partial command opcode, and/or second partial address) is provided (e.g., by controller 110) to the DQ interface. ACK is then asserted at time 353. Time 353 is at least a specified row operation to row operation delay ($t_{RR}$) after the first asynchronous activate row command was forwarded to access the memory core, the second assertion of ACK latches (or alternately, CKE is asserted 372) the third activate row information and fourth activate row information and forwards this information to a memory core (e.g., memory core 125). The memory core then activates the bank/row associated with the third activate row information and fourth activate row information.

In FIG. 3, concurrently with the memory device performing the second row activation, the memory device is brought out of the power conservation mode (e.g., by controller 110.) The synchronous timing reference signal CK is activated and begins periodically switching states at a frequency. After CK has stabilized, clock enable is asserted at time 354. This starts the processes internal to the memory device to exit the power conservation mode.

A specified interval (i.e., $t_{XP}$) after the assertion of the clock enable signal (and while CK is running and stable), at time 355, the memory device has entered the high-power mode. At time 356, which is a specified row to column delay ($t_{RCD}$) after the asynchronous activate row command was forwarded to access the memory core, a first column access command is synchronously received (i.e., synchronized by CK) via the CA interface.

At time 357, which is a specified row to data delay ($t_{RD}$) after the asynchronous activate row command was forwarded to access the memory core, data ($Q_0$) begins to be synchronously (i.e., synchronized by DQS) received (for a write) or transmitted (for a read) via the DQ interface. At time 358, which is a specified column access to column access ($t_{CC}$) after the first column access command, a second column access command is synchronously received (i.e., synchronized by CK) via the CA interface. In response to the second column access command, data ($Q_1$) is to be synchronously (i.e., synchronized by DQS) received or transmitted via the DQ interface subsequent to the data corresponding to the first column access command is respectively received or transmitted.

Figure 4:
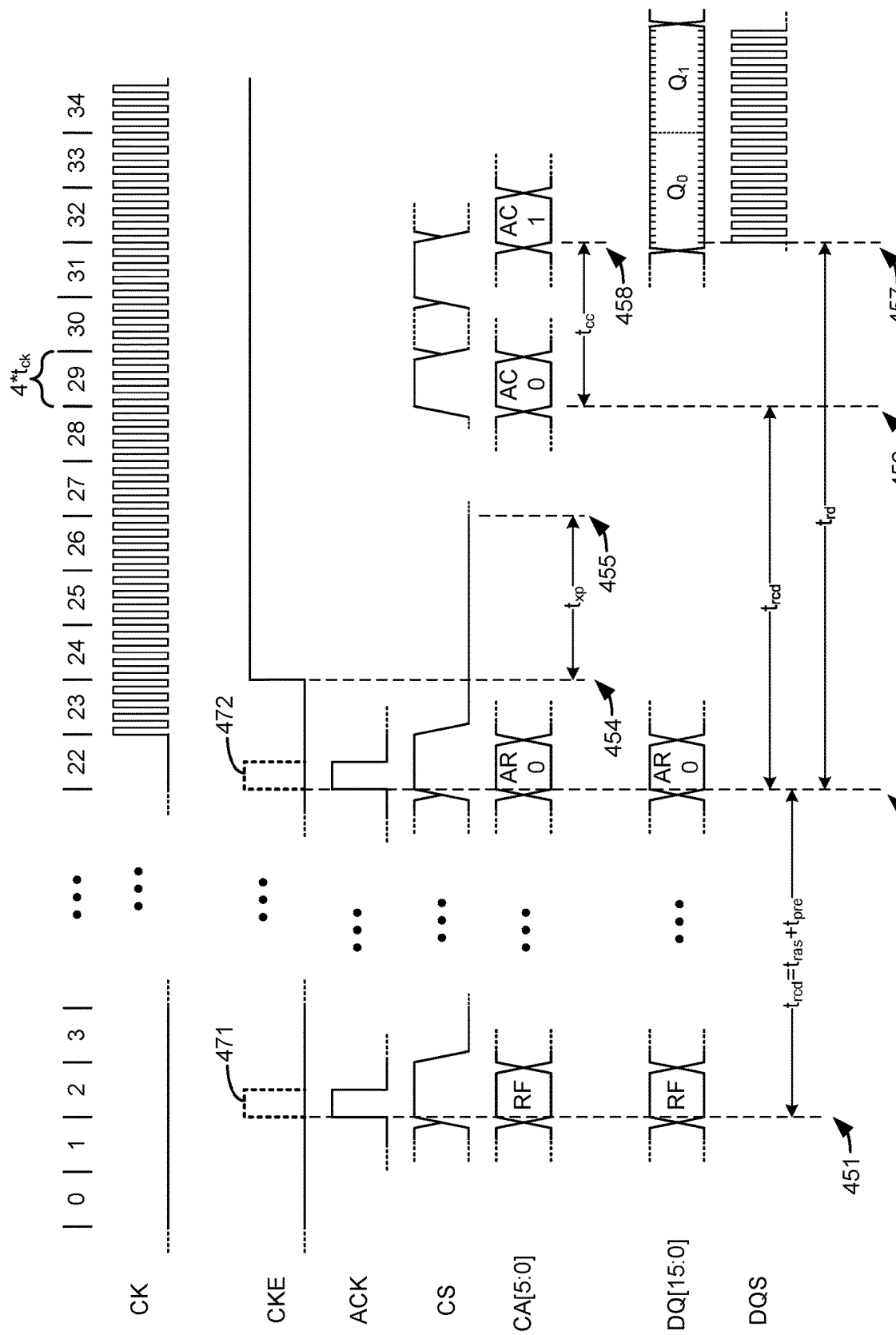
FIG. 4 is a timing diagram illustrating an example semi-deterministic asynchronous refresh followed by a low latency access.

FIG. 4 is a timing diagram illustrating an example semi-deterministic asynchronous refresh followed by a low latency access. The steps and timing illustrated in FIG. 4 may be performed by one or more elements of memory system 100. At the start of the timing diagram of FIG. 4, the memory device (e.g., memory device 120) has been controlled to operate in the power conservation mode: the synchronous interface clocks (CK, DQS) are inactive and thus not switching, the clock enable signal (CKE) is in an inactive state, the asynchronous timing signal (ACK) is in an inactive state, the command address (CA), data (DQ), and chip select (CS) signals are in unknown or 'don't care' states.

A setup time before ACK is first asserted in FIG. 4, the chip select signal is brought to an active state (e.g., by controller 110), first self-refresh information (e.g., a command opcode) is provided (e.g., by controller 110) to the CA interface, and second self-refresh information (e.g., a bank and/or row address) is provided (e.g., by controller 110) to the DQ interface. ACK is then asserted (at time 451). This latches (samples) the first self-refresh information and second self-refresh information. If a credit/debit counter that receives the ACK signal and an internal self-refresh timer signal indicates a refresh should be performed, the memory device forwards the address from the refresh counter to a memory core (e.g., memory core 125). The memory core then refreshes the bank/row associated with the refresh counter. If the self-refresh timer signal indicates does not indicate a refresh should be performed, then the refresh operation is not performed during the current refresh interval.

Note that in an embodiment, the asynchronous timing signal may be received via the clock enable interface. This is shown in FIG. 4 by pulse 471 on CKE. If the asynchronous timing signal may be received via the clock enable interface, the memory device may not include a dedicated ACK pin/pad/interface. In another embodiment, a mode or other control (e.g., control register value) may specify whether the asynchronous timing signal is received via a dedicated ACK interface or whether the asynchronous timing signal is received via the clock enable interface.

A setup interval before time 453, the chip select signal is brought to (or remains at) an active state (e.g., by controller 110), third activate row information (e.g., a second command opcode) is provided (e.g., by controller 110) to the CA interface, and fourth activate row information (e.g., a second bank/row address) is provided (e.g., by controller 110) to the DQ interface. ACK is then asserted a second time at time 453 (or alternately, CKE is asserted 472). Time 453 is at least a specified row operation plus precharge operation delay ($t_{RCD}=t_{RAS}+t_{PRE}$) after the first ACK was received. The second assertion of ACK latches (samples) first activate row information (i.e., on the CA interface) and second activate row information (i.e., on the DQ interface) and forwards this information to a memory core (e.g., memory core 125). The memory core then activates the bank/row associated with the first activate row information and second activate row information.

In FIG. 4, concurrently with the memory device performing the second row activation, the memory device is brought out of the power conservation mode. The synchronous timing reference signal CK is activated and begins periodically switching states a frequency. After CK has stabilized, clock enable is asserted at time 454. This starts the processes internal to the memory device to exit the power conservation mode.

After a specified interval (i.e., $t_{XP}$) after the assertion of the clock enable signal elapses (and while CK is running and stable), at time 455, the memory device has entered the high-power mode. At time 456, which is a specified row to column delay ($t_{RCD}$) after the asynchronous activate row command was forwarded to the memory core, a first column access command is synchronously received (i.e., synchronized by CK) via the CA interface.

At time 457, which is a specified row to data delay ($t_{RD}$) after the asynchronous activate row command was forwarded to the memory core, data ($Q_0$) begins to be synchronously (i.e., synchronized by DQS) received (for a write) or transmitted (for a read) via the DQ interface. At time 458, which is a specified column access to column access ($t_{CC}$) after the first column access command, a second column access command is synchronously received (i.e., synchronized by CK) via the CA interface. In response to the second column access command, data ($Q_1$) is to be synchronously (i.e., synchronized by DQS) received or transmitted via the DQ interface subsequent to the data corresponding to the first column access command being respectively received or transmitted.

It should be understood that by asserting ACK with the self-refresh operation periodically at, for example, a specified minimum refresh rate, a controller (e.g., controller 110) may be configured to not attempt an access from $t_{RCD}=t_{RAS}\pm t_{PRE}$ after the first ACK assertion. The controller will then be assured of being able to assert ACK and bring the memory device out of the power conservation mode at time 453 without interference (e.g., unknown delay) caused by the occurrence of an internally timed self-refresh. In this manner, the controller is assured of the timing of the second assertion of ACK, the timing of when the activate row command should be output, and when the data on DQ should be transferred (i.e., without interference/delay caused by an internally timed self-refresh.)

Figure 5:
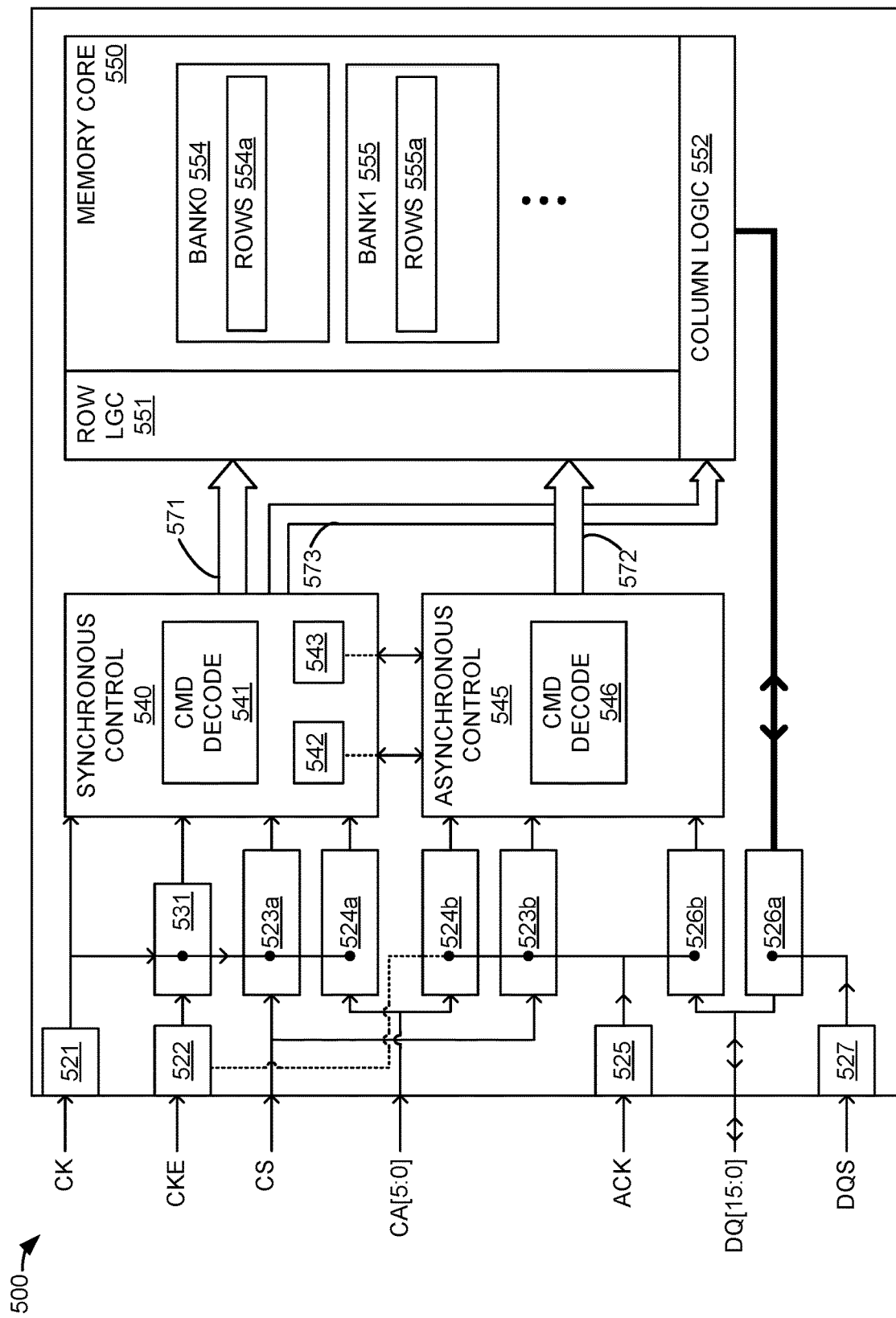
FIG. 5 is a block diagram illustrating a memory component.

FIG. 5 is a block diagram illustrating a memory component. In an embodiment, memory component 500 may correspond to memory device 120 in FIG. 1. Memory component 500 includes first synchronous timing reference (CK) interface 521, clock enable (CKE) interface 522, clock enable latch/sampler 531. synchronous chip select (CS) interface 523a, synchronous command/address (CA) interface 524a, synchronous data interface 526a, second synchronous timing reference (DQS) interface 527, asynchronous timing reference interface 525 (or alternately 522), asynchronous chip select (CS) interface 523b, asynchronous command/address (CA) interface 524b, asynchronous data interface 526b, synchronous control 540, asynchronous control 545, and memory core 550. Asynchronous control 540 includes command decode 541, refresh counter 542, and self-refresh timer 543. Asynchronous control 545 includes command decode 546. Memory core 550 includes row logic 551, column logic 552, multiple banks 554-555. Each bank 554-555 includes rows 554a-555a.

Clock enable interface 522 is operatively coupled to clock enable sampler 531. Clock enable interface 522 is optionally operatively coupled to asynchronous command interface 524b and asynchronous data interface 526b. Clock enable sampler 531 is operatively coupled to synchronous control 540.

Synchronous timing reference interface 521 is operatively coupled to synchronous clock enable sampler 531. Synchronous timing reference interface 521 is operatively coupled to clock enable sampler 531 in order to synchronously receive (i.e., synchronized to CK) the transfer of the clock enable signal (CKE) received at clock enable interface 522 before passing the synchronized clock enable signal to synchronous control 540.

Synchronous timing reference interface 521 is operatively coupled to synchronous chip select interface 523a. Synchronous timing reference interface 521 is operatively coupled to chip select interface 523a, in order to synchronously receive (i.e., synchronized to CK) the chip select signal (CS) received at chip select interface 523a before passing a synchronized chip select signal (CS) to synchronous control 540.

Synchronous timing reference interface 521 is operatively coupled to synchronous command/address interface 524a. Synchronous timing reference interface 521 is operatively coupled to synchronous command/address interface 524a in order to synchronously receive (i.e., synchronized to CK) the command/address signals CA[5:0] received at command/address interface 524a before passing synchronized command/address signals CA[5:0] to synchronous control 540.

Synchronous timing reference interface 527 is operatively coupled to synchronous data interface 526a. Synchronous timing reference interface 527 is operatively coupled to synchronous data interface 526a in order to synchronously receive or transmit (i.e., synchronized to DQS) the transfer of the data signals DQ[15:0] to/from memory core 550 (and to/from column logic 552, in particular.) Synchronous data interface 526a is operatively coupled to memory core 550 (and column logic 552, in particular) to receive data being read from memory core 550 for transmission external to memory device 500 and to provide data received by memory device 500 that is to be written to memory core 550.

Asynchronous timing reference interface 525 is operatively coupled to asynchronous chip select interface 523b. Asynchronous timing reference interface 525 is operatively coupled to chip select interface 523b, in order to asynchronously sample (i.e., not synchronized to CK, but in response to a transition of ACK or optionally CKE) the chip select signal (CS) present at chip select interface 523b before passing the sampled chip select signal (CS) to asynchronous control 545.

Asynchronous timing reference interface 525 is operatively coupled to asynchronous command/address interface 524b. Asynchronous timing reference interface 525 is operatively coupled to asynchronous command/address interface 524b in order to asynchronously sample (i.e., not synchronized to CK, but in response to a transition of ACK, or alternately CKE) the command/address signals CA[5:0] present at command/address interface 524b before passing the sampled command/address signals CA[5:0] to asynchronous control 545.

Asynchronous timing reference interface 525 is operatively coupled to asynchronous data interface 526b. Asynchronous timing reference interface 525 is operatively coupled to asynchronous data interface 526b in order to asynchronously sample command and/or address signals present at asynchronous data interface 526b before passing the sampled signals to asynchronous control 545.

Synchronous control 540 is operatively coupled to row logic 551 of memory core 550 by synchronously initiated row control signals 571. Synchronous control 540 is operatively coupled to column logic 552 of memory core 550 by synchronously initiated column control signals 573. Asynchronous control 545 is operatively coupled to row logic 551 of memory core 550 by asynchronously initiated row control signals 572. Asynchronous control 545 may optionally be operatively coupled to at least one of refresh counter 542 and self-refresh timer 543.

In an embodiment, synchronous timing reference (CK) interface 521 receives a first timing signal, CK, that determines a synchronous sampling of the CKE, CS, and CA signals. Synchronous timing reference (DQS) interface 527 receives a second timing signal, DQS, that determines a synchronous sampling and/or transmission of the DQ signals. Memory core 550 may be controlled by synchronous control 540 (e.g., when in a high-power mode) to receive first command, first control, and first address information via a first synchronous sampling of the CA links using CK.

Memory core 550 may also be controlled by asynchronous control 545 (e.g., when in a power conservation mode) receive second command, second control, and second address information via an asynchronous sampling of the CA links and the DQ links using ACK. The second command, second control, and second address information may communicate an activation of a row in a bank of the memory core. While the row in the bank is being activated, memory device 500 may be controlled to exit the power conservation mode and perform a column operation synchronously (e.g., controlled by synchronous control 540 and using CK and DQ to synchronize column operations). See, for example, FIG. 2 and associated discussion.

While in a power conservation mode, synchronous interfaces 523a, 524a, and 526a may be placed in a low power state. This low power state may include powering down interfaces 523a, 524a, and/or 526a. This low power state may include controlling interfaces 523a, 524a, and/or 526a to not sample the links connected to them. Also, in the power conservation mode, CK may be inactivated (i.e., controlled to not toggle and remain in a steady logic state.)

As discussed herein, in an embodiment, the CKE signal may be used to control the entry to, and/or exit from, the power conservation mode. An exit from the power conservation mode may be initiated by first activating CK and then the synchronous (to CK) sampling of the CKE signal by latch 531. CKE may also be used to receive the ACK signal that initiates asynchronous sampling of the CA and DQ links.

In an embodiment, interfaces 523a, 523b, 524a, 525b may be aggregately viewed as a first interface that, when memory device 500 is in a high-power mode, receives command, address, and control signals synchronously with respect to the received CK signal. Likewise, when memory device 500 is in the high-power mode, interfaces 526a and 526b may be aggregately viewed as second interface that bidirectionally communicates data synchronously with respect to the received DQS signal. However, when memory device 500 is in a power conservation mode, this first interface and this second interface collectively receive command, address, and control signals in response to at least one transition on ACK (or when enabled as such, CKE).

Memory core 550 may, when memory device 500 is in the high-power mode, be controlled (e.g., by synchronous control 540) to activate a first row in response to the command, address, and control signals synchronously received via the first interface with respect to CK. Memory core 550 may, when memory device 500 is in the power conservation mode, be controlled (e.g., by asynchronous control 545) to activate a second row in response to the command, address, and control signals sampled on the first and second interfaces in response to ACK. Following the activation of the second row, memory device 500 may be controlled to exit the power conservation mode so that the second interface can communicate read/write data synchronously with respect to DQS.

When in the power conservation mode, the first interface may receive a portion of the command, address and control signals while the the second interface receives the remaining portion of the command, address and control signals. For example, the first interface may receive command and control signal information while the second interface (at least some) address signals.

Figure 6:
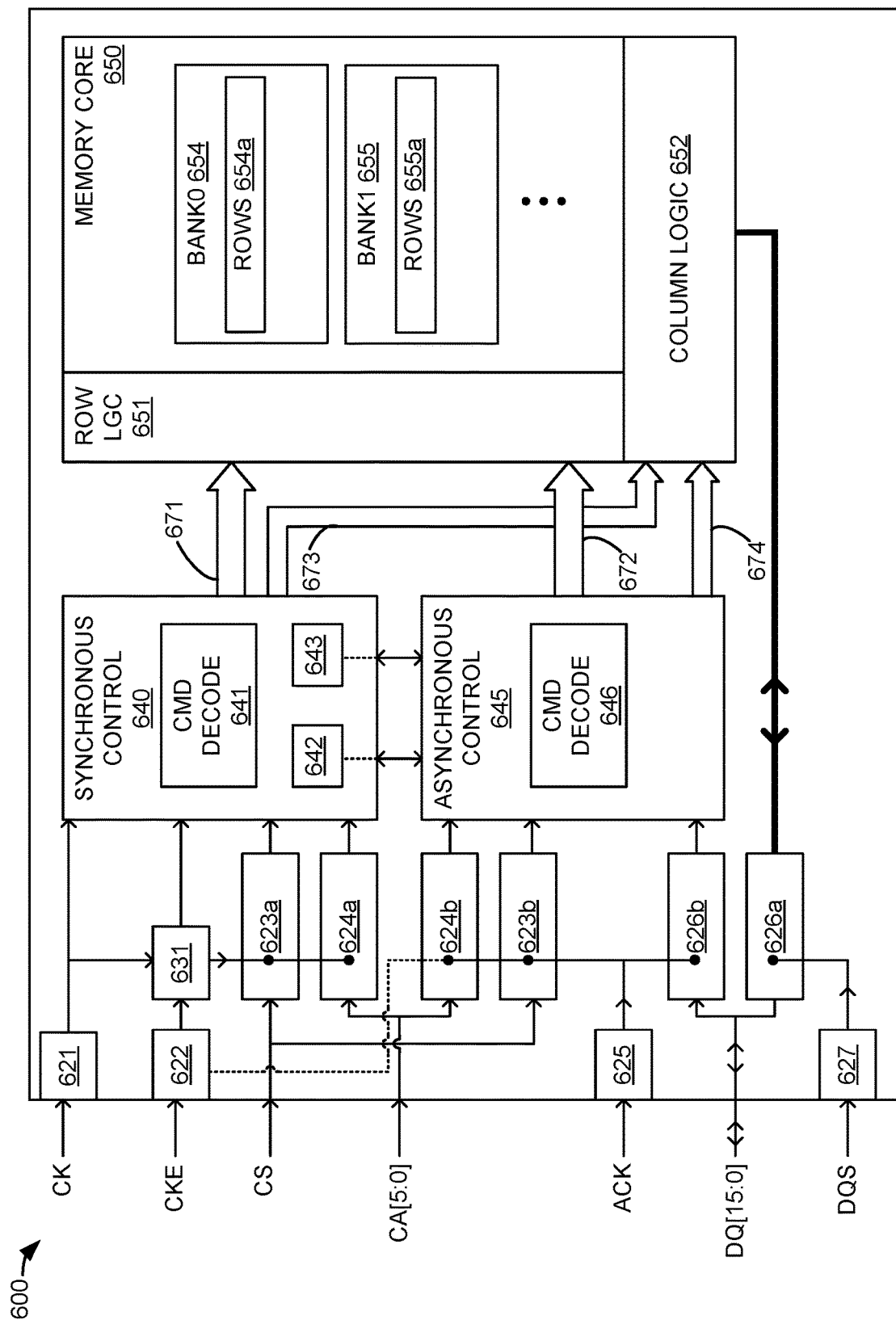
FIG. 6 is a block diagram illustrating a memory component with asynchronously initiated column operations.

FIG. 6 is a block diagram illustrating a memory component with asynchronously initiated column operations. In an embodiment, memory component 600 may correspond to memory device 120 in FIG. 1. Memory component 600 includes first synchronous timing reference (CK) interface 621, clock enable (CKE) interface 622, clock enable sampler 631. synchronous chip select (CS) interface 623a, synchronous command/address (CA) interface 624a, synchronous data interface 626a, second synchronous timing reference (DQS) interface 627, asynchronous timing reference interface 625 (or alternately 622), asynchronous chip select (CS) interface 623b, asynchronous command/address (CA) interface 624b, asynchronous data interface 626b, synchronous control 640, asynchronous control 645, and memory core 650. Asynchronous control 640 includes command decode 641, refresh counter 642, and self-refresh timer 643. Asynchronous control 645 includes command decode 646. Memory core 650 includes row logic 651, column logic 652, multiple banks 654-655. Each bank 654-655 includes rows 654a-655a.

Clock enable interface 622 is operatively coupled to clock enable sampler 631. Clock enable interface 622 is optionally operatively coupled to asynchronous command interface 624b and asynchronous data interface 626b. Clock enable sampler 631 is operatively coupled to synchronous control 640.

Synchronous timing reference interface 621 is operatively coupled to synchronous clock enable sampler 631. Synchronous timing reference interface 621 is operatively coupled to clock enable sampler 631 in order to synchronously receive (i.e., synchronized to CK) the transfer of the clock enable signal (CKE) received at clock enable interface 622 before passing the synchronized clock enable signal to synchronous control 640.

Synchronous timing reference interface 621 is operatively coupled to synchronous chip select interface 623a. Synchronous timing reference interface 621 is operatively coupled to chip select interface 623a, in order to synchronously receive (i.e., synchronized to CK) the chip select signal (CS) received at chip select interface 623a before passing a synchronized chip select signal (CS) to synchronous control 640.

Synchronous timing reference interface 621 is operatively coupled to synchronous command/address interface 624a. Synchronous timing reference interface 621 is operatively coupled to synchronous command/address interface 624a in order to synchronously receive (i.e., synchronized to CK) the command/address signals CA[5:0] received at command/address interface 624a before passing synchronized command/address signals CA[5:0] to synchronous control 640.

Synchronous timing reference interface 627 is operatively coupled to synchronous data interface 626a. Synchronous timing reference interface 627 is operatively coupled to synchronous data interface 626a in order to synchronously receive or transmit (i.e., synchronized to DQS) the transfer of the data signals DQ[15:0] to/from memory core 650 (and to/from column logic 652, in particular.) Synchronous data interface 626a is operatively coupled to memory core 650 (and column logic 652, in particular) to receive data being read from memory core 650 for transmission external to memory device 600 and to provide data received by memory device 600 that is to be written to memory core 650.

Asynchronous timing reference interface 625 is operatively coupled to asynchronous chip select interface 623b. Asynchronous timing reference interface 625 is operatively coupled to chip select interface 623b, in order to asynchronously sample (i.e., not synchronized to CK, but in response to a transition of ACK or optionally CKE) the chip select signal (CS) present at chip select interface 623b before passing the sampled chip select signal (CS) to asynchronous control 645.

Asynchronous timing reference interface 625 is operatively coupled to asynchronous command/address interface 624b. Asynchronous timing reference interface 625 is operatively coupled to asynchronous command/address interface 624b in order to asynchronously sample (i.e., not synchronized to CK, but in response to a transition of ACK or optionally CKE) the command/address signals CA[5:0] present at command/address interface 624b before passing the sampled command/address signals CA[5:0] to asynchronous control 645.

Asynchronous timing reference interface 625 is operatively coupled to asynchronous data interface 626b. Asynchronous timing reference interface 625 is operatively coupled to asynchronous data interface 626b in order to asynchronously sample command and/or address signals present at asynchronous data interface 626b before passing the sampled signals to asynchronous control 645.

Synchronous control 640 is operatively coupled to row logic 651 of memory core 650 by synchronously initiated row control signals 671. Synchronous control 640 is operatively coupled to column logic 652 of memory core 650 by synchronously initiated column control signals 673. Asynchronous control 645 is operatively coupled to row logic 651 of memory core 650 by asynchronously initiated row control signals 672. Asynchronous control 645 is operatively coupled to column logic 652 of memory core 650 by asynchronously initiated column control signals 674. Asynchronous control 645 may optionally be operatively coupled to at least one of refresh counter 642 and self-refresh timer 643.

From the foregoing, it should be understood the memory device 600 is similar to memory device 500 with the added functionality of allowing asynchronously initiated column operations to be performed (e.g., in power conservation mode, in response to ACK, and controlled by asynchronous control 645.) Thus, it should also be understood that, in an embodiment, memory device 600 may perform all of the functions described herein with respect to memory device 100 and memory device 500.

In an embodiment, synchronous control 640 and asynchronous control 645 cooperate to operate memory device 600 in at least a first mode (e.g., high-power) and a second mode (e.g., power conservation). Synchronous control 640 and asynchronous control 645 also cooperate to operate interfaces 623a, 623b, 624a, and 624b as a command/address interface. Likewise, synchronous control 640 and asynchronous control 645 also cooperate to operate interfaces 626a, 626b as a data interface. Timing reference interface 621 receives a first timing reference signal, CK, that is, when active, periodic at a first frequency. Timing reference interface 627 receives a second timing reference signal, DQS, that is, when active, periodic at a second frequency. The first frequency and the second frequency may be the same frequency, or different frequencies. Asynchronous timing reference interface 625 receives a timing signal, ACK.

Memory core 650, based at least in part on memory component 600 being operated in the first mode (e.g., by synchronous control 640), receives first information that is provided to the command/address interface synchronously with CK. This first information includes address information sufficient to activate a first row 654a-655a of a first bank 654-655 of memory core 650.

Memory core 650 also, based at least in part on memory component 600 being operated in the second mode (e.g., by asynchronous control 645), receives second information that is provided to the command/address interface and third information that is provided to the data interface asynchronously to both CK and DQS. The second information is sampled from the command/address interface based at least in part on ACK. The third information is sampled from the data interface based at least in part on ACK. The second information and the third information aggregately including address information sufficient to activate a second row 654a-655a of a second bank 654-655 of memory core 650.

In an embodiment, receipt of the second information and the third information by memory core 650 initiates a self-timed activation of the second row 654a-655a of the second bank 654-655 memory core 650. Based on memory component 600 being operated in the first mode, the signal interface is to be provided with a control signal, CKE, that enables the command/address interface to receive command/address information synchronously with respect to the first timing reference signal and enables the data interface to communicate data synchronously with respect to the second timing reference signal. As also discussed herein, the column operations may be received and/or performed after memory device 600 has exited power conservation mode. Thus, during the self-timed activation, the second synchronous timing reference signal, DQS, may be activated and the data interface may be enabled to communicate data synchronously with respect to DQS.

Figure 7:
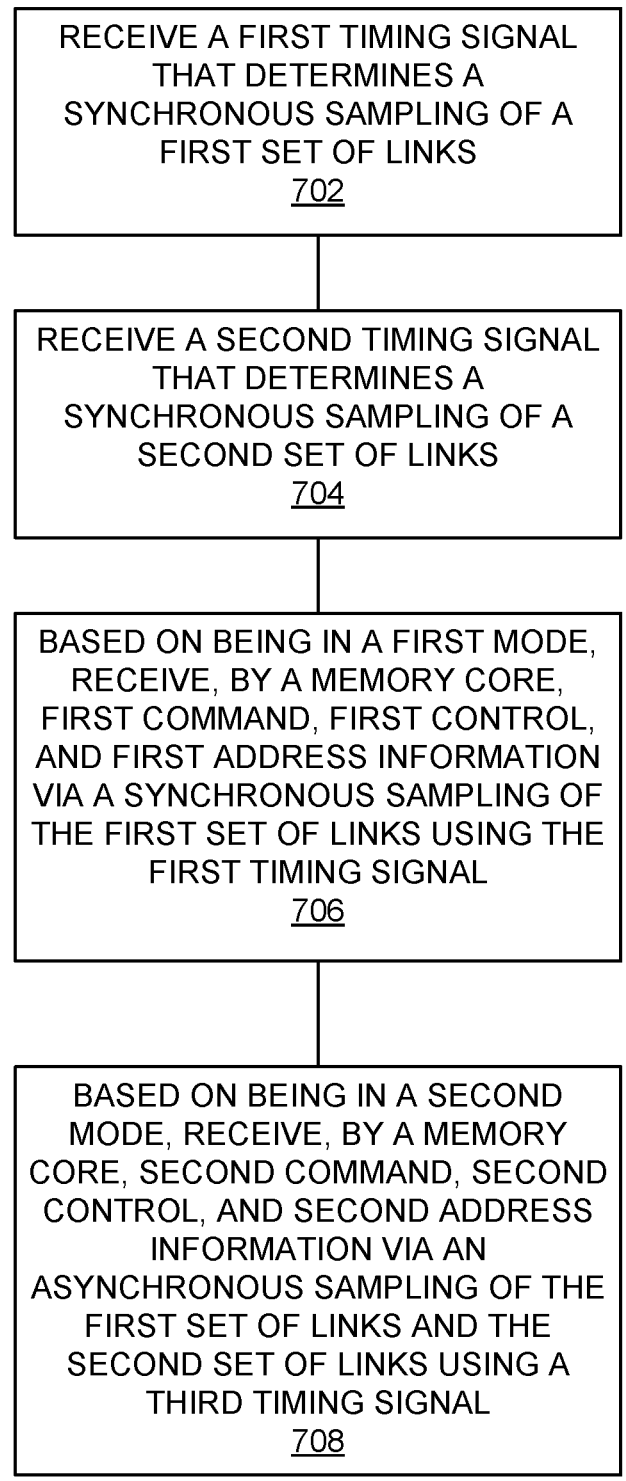
FIG. 7 is a flowchart illustrating a method of operating a memory device.

FIG. 7 is a flowchart illustrating a method of operating a memory device. Steps illustrated in FIG. 7 may be performed by one or more elements of memory system 100, memory device 500, and/or memory device 600. A first timing signal that determines a sampling of a first set of links is received (702). For example, timing reference interface 521 may receive, timing signal CK which controls the synchronous sampling of the CA signals from a controller (e.g., controller 110).

A second timing signal that determines a synchronous sampling of a second set of links is received (704). For example, timing reference interface 527 may receive timing signal DQS which controls the synchronous sampling of the DQ signals from a controller (e.g., controller 110).

Based on being in a first mode, a memory core receives first command, first control, and first address information via a synchronous sampling of the first set of links using the first timing signal (706). For example, memory core 550 may receive command, control and address information from synchronous control 540. Synchronous control 540 may have received this command, control, and address information via the synchronous sampling of the CA signals (e.g., by interfaces 523a and 524a) using CK. Based on being in a second mode, a memory core receives second command, second control, and second address information via an asynchronous sampling of the first set of links and the second set of links using a third timing signal. For example, memory core 550 may receive command, control and address information from asynchronous control 545. Asynchronous control 545 may have received this command, control, and address information via the asynchronous sampling of the CA signals (e.g., by interfaces 523b and 524b) using ACK and the asynchronous sampling of the DQ signals (e.g., by interface 526b) using ACK.

Figure 8:
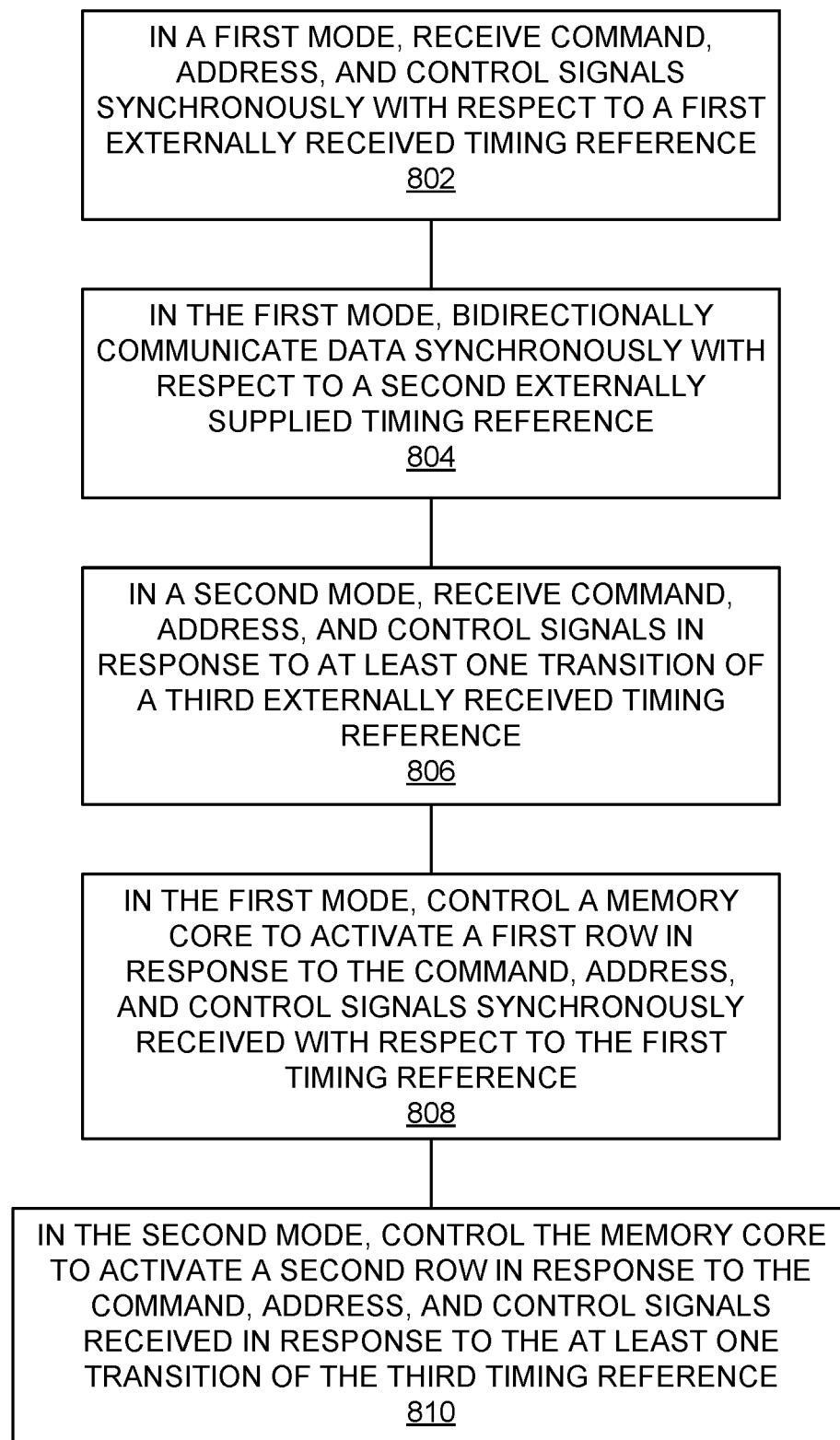
FIG. 8 is a flowchart illustrating a method of operating a memory device in at least two modes.

FIG. 8 is a flowchart illustrating a method of operating a memory device in at least two modes. Steps illustrated in FIG. 8 may be performed by one or more elements of memory system 100, memory device 500, and/or memory device 600. In a first mode, command, address, and control signals are received synchronously with respect to a first externally received timing reference (802). For example, memory device 120 may receive the CKE, CS, CA signals sent by controller 110 synchronously with respect to the CK signal sent by controller 110.

In the first mode, data is bidirectionally communicated synchronously with respect to a second externally supplied timing reference (804). For example, memory device 120 may receive the DQ signals sent by controller 110 synchronously with respect to the DQS signal sent by controller 110, or transmit DQ signals to controller 110 synchronously with respect to the DQS signal sent by controller 110.

In a second mode, command address and control signals received in response to at least one transition of a third externally received timing reference (806). For example, memory device 120 may receive command, address, and control signals in response to a transition by the ACK signal sent by controller 110. These command, address, and control signals, may be received via the CKE, CS, CA, and DQ signal interfaces to memory device 120.

In the first mode, a memory core is controlled to activate a first row in response to the command address and control signals synchronously received with respect to the first timing reference (808). For example, mode #1 control 121 may respond to the command, address, and control signals synchronously received on the CA signal interface by activating a corresponding first row in memory core 125.

In the second mode, the memory core is controlled to activate a second row in response to the command, address, and control signals, received in response to the at least one transition of the third timing reference (810). For example, mode #2 control 122 may respond to the command, address, and control signals received in response to transition on the ACK signal sent by controller 110 by activating a corresponding second row in memory core 125.

Figure 9:
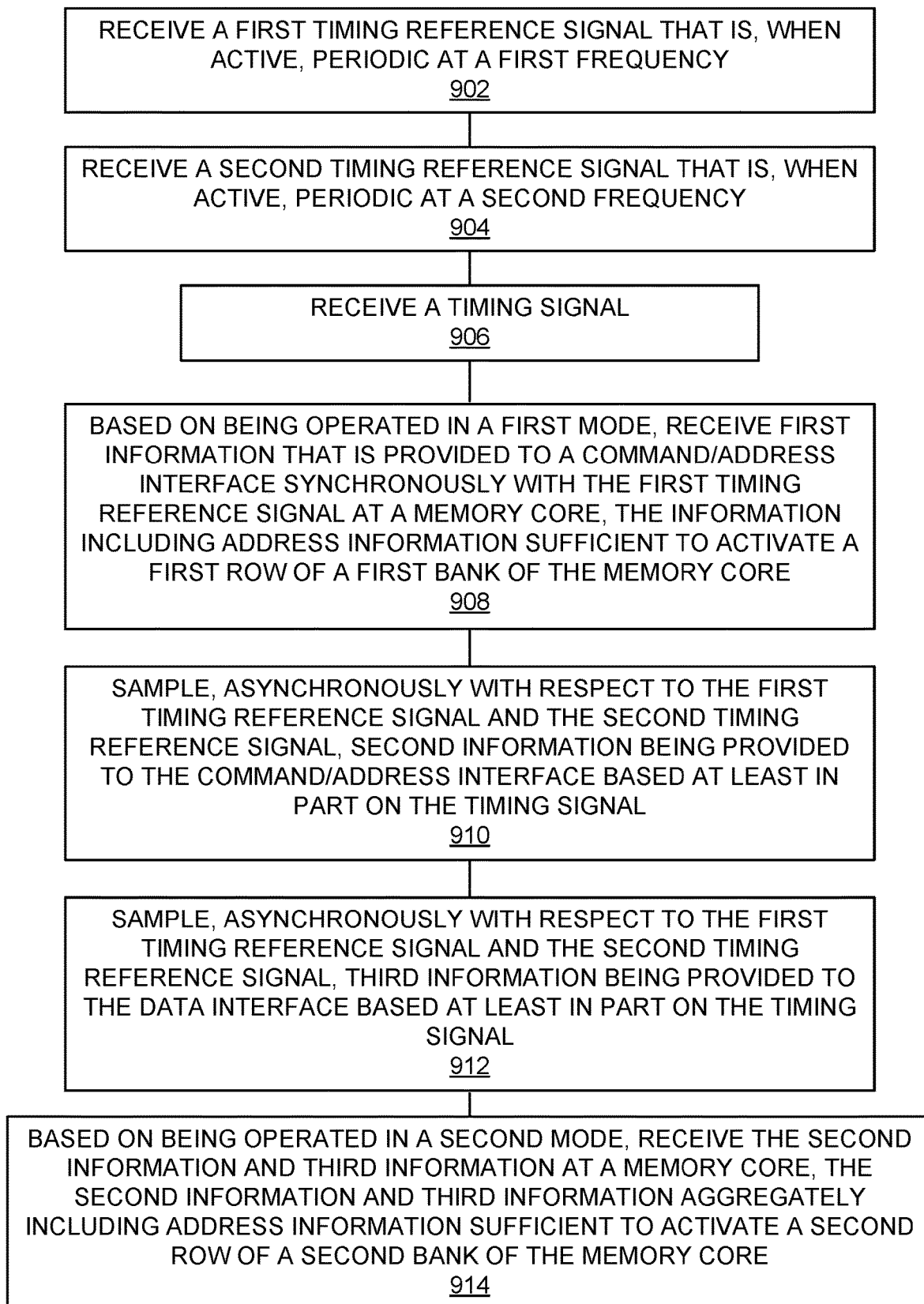
FIG. 9 is a flowchart illustrating a method of operating a memory device.

FIG. 9 is a flowchart illustrating a method of operating a memory device. Steps illustrated in FIG. 9 may be performed by one or more elements of memory system 100, memory device 500, and/or memory device 600. A first timing reference signal that is, when active, periodic at a first frequency is received (902). For example, memory device 500 may receive at interface 521 a clock signal, CK, that is when active periodic at a first frequency. A second timing reference signal that is, when active, periodic at a second frequency is received (904). For example, memory device 500 may receive, at interface 527, a clock signal, DQS, that is, when active, periodic at a second frequency. A timing signal is received (906). For example, memory device 500 may receive at interface 522 (or, if so configured, interface 525), a timing signal from controller 110.

Based on being operated in a first mode, first information that is provided to a command/address interface synchronously with the first timing reference signal is received at a memory core. This information includes address information sufficient to activate a first row of a first bank of the memory core (908). For example, based on being operated in a high-power synchronous mode, memory core 550 may receive, from synchronous control 540, command, control, and address information that specifies a row activate command and row address where this information was provided to the CKE, CS, and CA signal interfaces synchronously with respect to the CK signal.

Second information being provided to the command/address interface is asynchronously sampled with respect to the first timing reference signal and the second timing reference signal based at least in part on the timing signal (910). For example, command, control, or address information may be sampled from the CKE, CS, or CA signal interfaces asynchronous to CK and DQS signals based at least in part on an edge on the ACK signal. Third information being provided to the data interface is asynchronously sampled with respect to the first timing reference signal and the second timing reference signal based at least in part on the timing signal (912). For example, command, control, or address information may be sampled from the DQ signal interface asynchronous to CK and DQS signals based at least in part on a transition of the ACK signal.

Based on being operated in a second mode, the second information and third information is received at a memory core. The second information and the third information aggregately including address information that is sufficient to activate a second row of a second bank of the memory core (914). For example, based on being operated in a power conservation asynchronous mode, memory core 550 may receive, from asynchronous control 545, command, control, and address information that specifies a row activate command and row address where this information was provided to the CA and DQ signal interfaces asynchronously with respect to the CK signal and the DQS signal.

Figure 10:
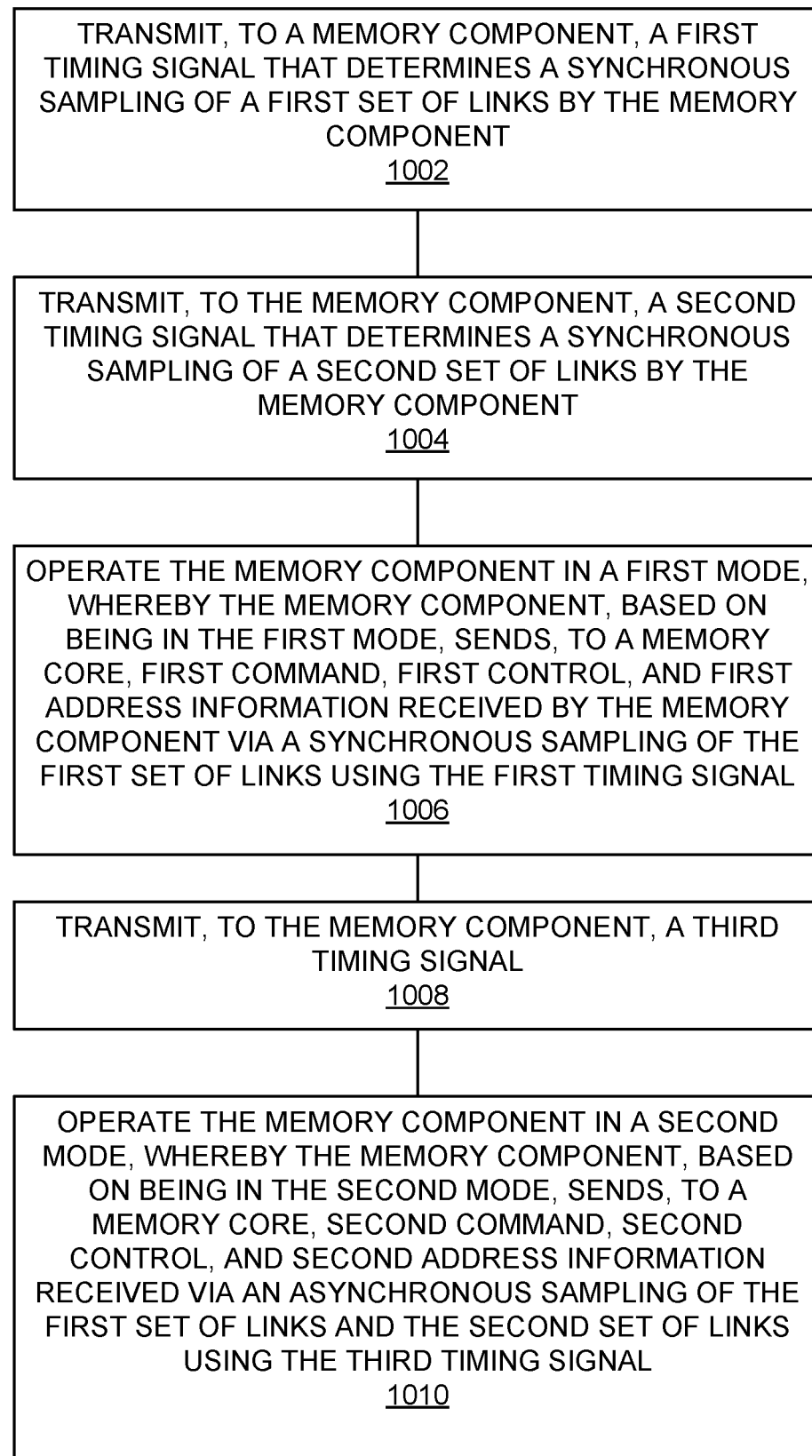
FIG. 10 is a flowchart illustrating a method of operating a memory controller.

FIG. 10 is a flowchart illustrating a method of operating a memory controller. Steps illustrated in FIG. 10 may be performed by one or more elements of memory system 100. To a memory component, a first timing signal that determines a synchronous sampling of a first set of links by the memory component is transmitted (1002). For example, controller 110 may transmit a timing reference signal, CK, that is used by memory device 120 sample the CKE, CS, and CA interfaces of memory device 120.

To the memory component, a second timing signal that determines a synchronous sampling of a second set of links by the memory component is transmitted (1004). For example, controller 110 may transmit a timing reference signal, DQS, that is used by memory device 122 sample the DQ interface of memory device 120.

The memory component is operated in a first mode, whereby the memory component, based on being operated in the first mode, sends, to a memory core, first command, first control, and first address information, received by the memory component via a synchronous sampling of the first set of links using the first timing signal (1006). For example, controller 110 (and mode #1 control circuitry 111, in particular) may operate memory device 120 in a high-power synchronous mode whereby the CKE, CS, and CA signals are sampled by memory device 120 synchronously with respect to CK. In this high-power synchronous mode controller 110 may send to memory device 120 first command, first control, and first address information via the CA signals.

A third timing signal is transmitted to the memory component (1008). For example, controller 110 may send, via the ACK interface or, when appropriately configured, the CKE interface, a timing transition. The memory component is operated in a second mode, whereby the memory component, based on being operated in the second mode, sends, to the memory core, second command, second control, and second address information, received by the memory component via an asynchronous sampling of the first set of links and the second set of links using the third timing signal (1010). For example, controller 110 (and mode #2 control circuitry 112, in particular) may operate memory device 120 in a power conservation asynchronous mode whereby the CKE, CS, and CA signals are sampled in response to ACK by memory device 120 but asynchronously with respect to CK and DQS. In this power conservation mode controller 110 may send to memory device 120 the second command, second control, and second address information using both the CA signals and at least some of the DQ signals.

Figure 11:
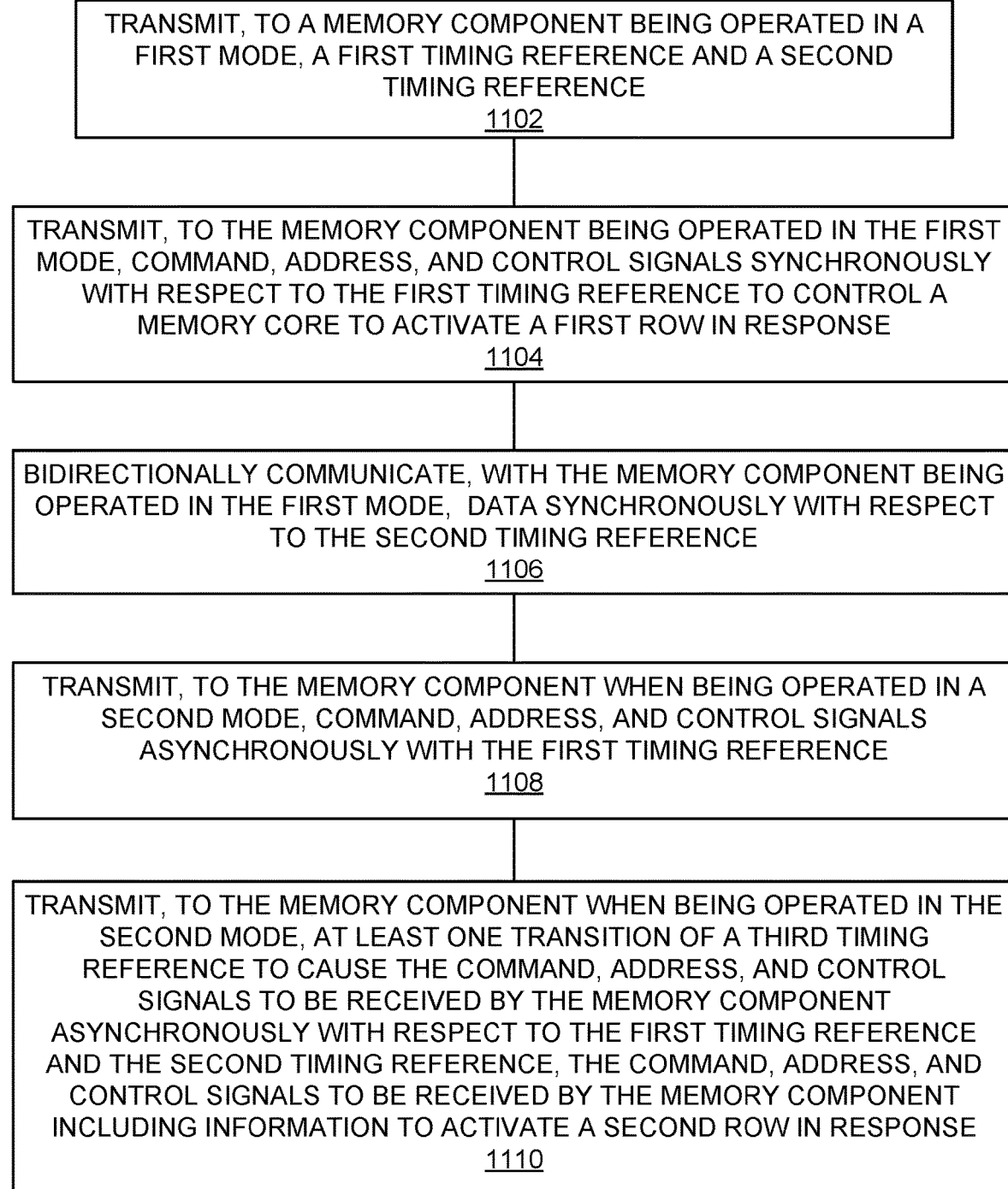
FIG. 11 is a flowchart illustrating a method of operating a memory controller to control a memory device that has at least two modes.

FIG. 11 is a flowchart illustrating a method of operating a memory controller to control a memory device that has at least two modes. Steps illustrated in FIG. 11 may be performed by one or more elements of at least memory system 100. To a memory component being operated in a first mode, a first timing reference and a second timing reference are transmitted (1102). For example, controller 110 may transmit, to memory device 120 while it is in a first mode, a periodic CK timing reference signal and a periodic DQS timing reference signal.

To the memory component being operated in the first mode, command, address, and control signals, are transmitted synchronously with respect to the first timing reference to control a memory core to activate a first row in response (1104). For example, controller 110 may transmit synchronously with the CK signal, CA signals that control a memory device 120 to activate a corresponding row in response.

With the memory component being operated in the first mode, data is bidirectionally and synchronously communicated with respect to the second timing reference (1106). For example, controller 110 may receive read data (in response to a read command) or send write data (based on sending a write command) to memory device 120 via the DQ signal interface synchronously with respect to the DQS signal.

To the memory component, when being operated in a second mode, and asynchronously with respect to the first timing reference, command, address, and control signals are transmitted (1108). For example, when memory device 120 is being operated in a low power asynchronous mode, controller 110 may transmit command, address, and control signals asynchronously with respect to the CK signal.

At least one transition of a third timing reference signal is transmitted to the memory component when being operated in the second mode to cause the command, address, and control signals to be received by the memory component asynchronously with respect to the first timing reference and the second timing reference. The command, address, and control signals to be received by the memory component including information sufficient to activate a second row in response (1110). For example, when memory device 120 is being operated in a low power asynchronous mode, controller 110 may transmit a signal transition on ACK (or CKE if so configured) to cause memory device 120 to asynchronously sample at least CA and DQ (or a subset thereof).

Figure 12:
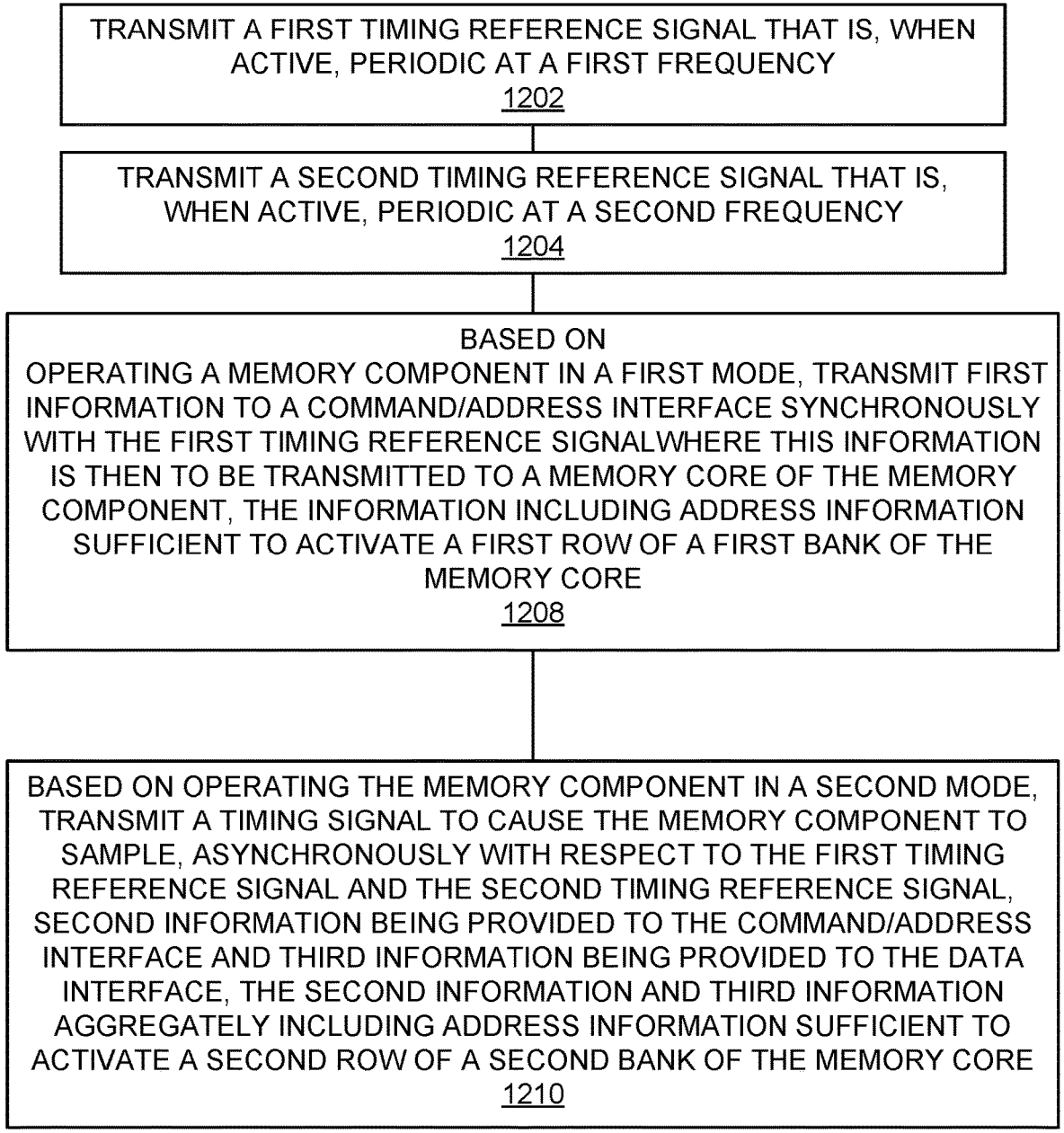
FIG. 12 is a flowchart illustrating a method of operating a memory controller to control a memory device.

FIG. 12 is a flowchart illustrating a method of operating a memory controller to control a memory device that has at least two modes. Steps illustrated in FIG. 12 may be performed by one or more elements of memory system 100. A first timing reference signal that is, when active, periodic at a first frequency is transmitted (1202). For example, controller 110 may transmit, to memory device 110, a periodic timing reference signal, CK. A second timing reference signal that is, when active, periodic at a second frequency is transmitted (1204). For example, controller 110 may transmit, to memory device 110, a periodic timing reference signal, DQS.

Based on operating a memory component in a first mode, transmit first information to a command/address interface synchronously with respect to the first timing reference signal where this information is to then be transmitted to a memory core of the memory component. The information including address information that is sufficient to activate a first row of a first bank of the memory core (1208). For example, controller 110 may transmit command, address, and control information to memory device 120 synchronously with respect to timing reference signal CK.

Based on operating the memory component in a second mode, a timing signal is transmitted to cause the memory component to sample, asynchronously with respect to the first timing reference signal and the second timing reference signal, second information being provided to the command/address interface and third information being provided to the data interface based. The second information and third information aggregately including address information sufficient to activate a second row of a second bank of the memory core (1210). For example, controller 110 may transmit command, address, and control information to memory device 120 via the CA and DQ asynchronously with respect to timing reference signal CK and the timing reference signal DQS. Controller 110 may transmit a transition on the ACK interface asynchronously with respect to timing reference signal CK and the timing reference signal DQS where the transition on ACK causes memory device 120 to sample the command, address, and control information to memory device 120 being provided to the CA and DQ interfaces.

Figure 13:
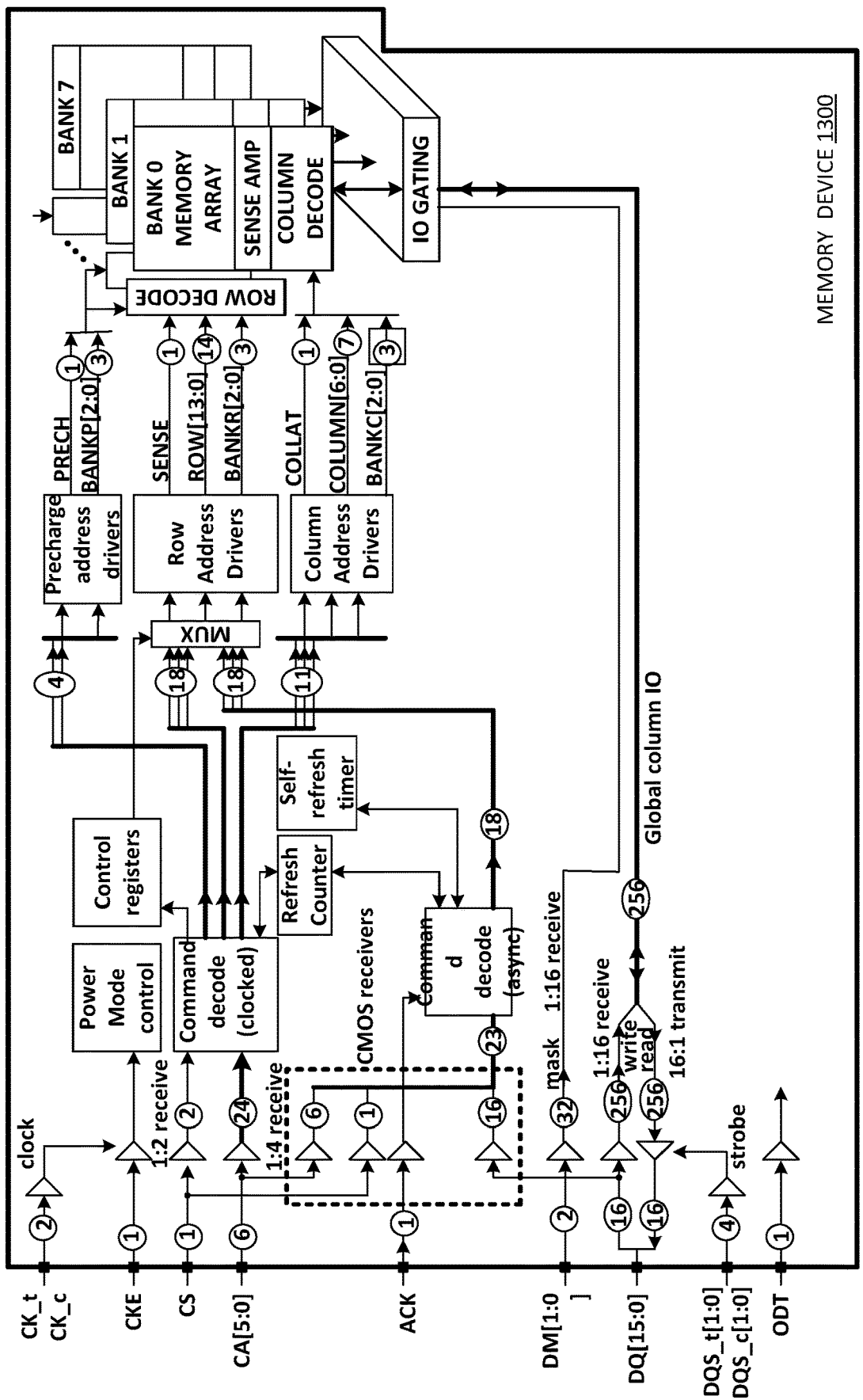
FIG. 13 is a block diagram of a memory device.
Figure 14:
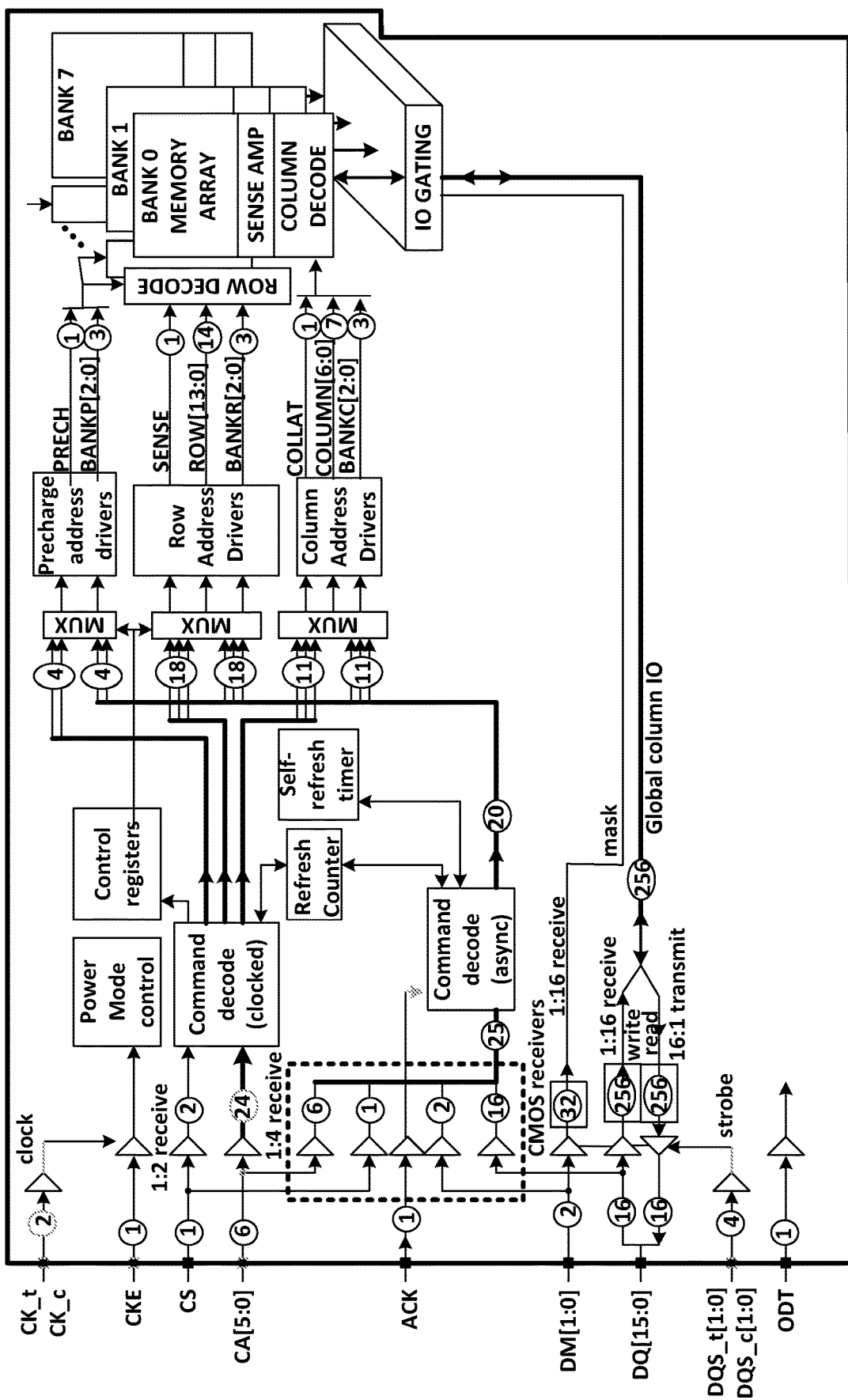
FIG. 14 is a block diagram of a memory device.

FIG. 13 is a block diagram of a memory device. In particular, memory device 1300 in FIG. 13 may be considered as a more detailed example of at least memory device 500 and/or memory device 100. FIG. 14 is a block diagram of a memory device. In particular, memory device 1400 in FIG. 14 may be considered as a more detailed example of at least memory device 600 and/or memory device 100.

Figure 15:
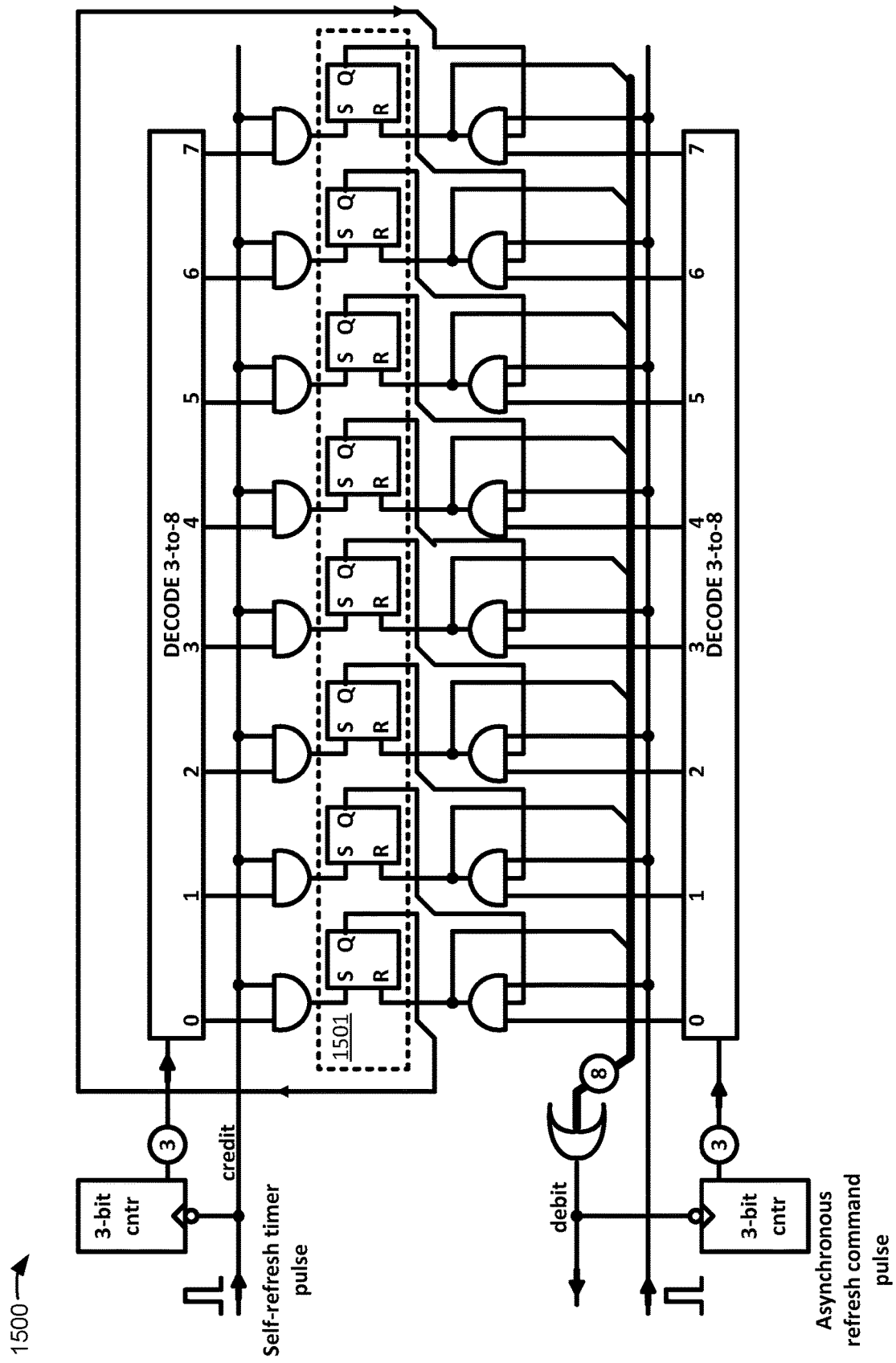
FIG. 15 is a schematic diagram of a credit/debit counter for self-refresh.

FIG. 15 is a schematic diagram of a credit/debit counter for self-refresh. In particular, credit/debit counter 1500 may be considered as an example credit/debit counter referenced herein. Upon reset, it should be understood that both 3-bit counters illustrated in FIG. 15 are cleared to zero logic values.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of system 100, controller 110, memory device 100, memory device 500, memory device 600, memory device 1300, memory device 1400, counter 1500, and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 16:
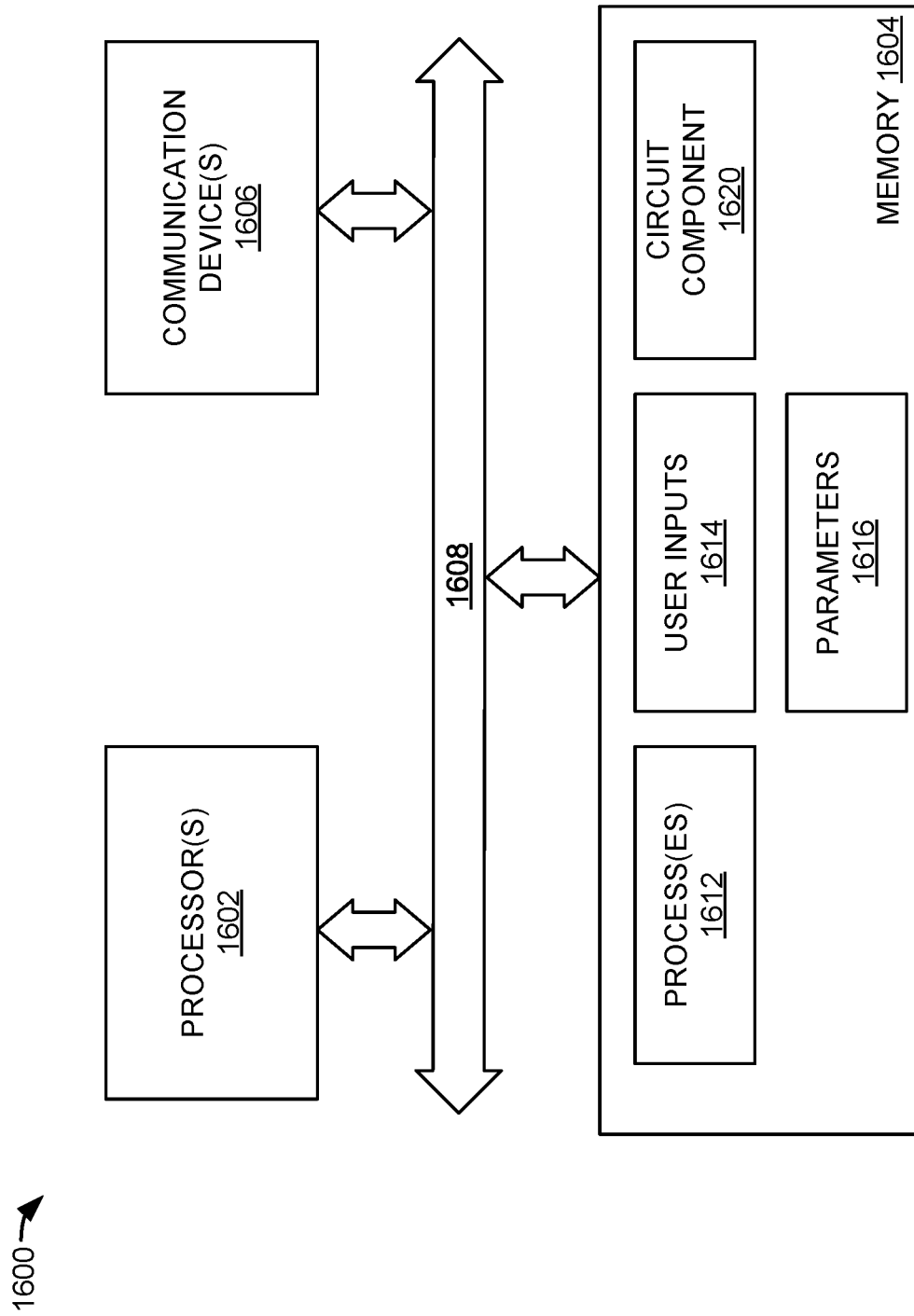
FIG. 16 is a block diagram of a processing system.

FIG. 16 is a block diagram illustrating one embodiment of a processing system 1600 for including, processing, or generating, a representation of a circuit component 1620. Processing system 1600 includes one or more processors 1602, a memory 1604, and one or more communications devices 1606. Processors 1602, memory 1604, and communications devices 1606 communicate using any suitable type, number, and/or configuration of wired and/or wireless connections 1608.

Processors 1602 execute instructions of one or more processes 1612 stored in a memory 1604 to process and/or generate circuit component 1620 responsive to user inputs 1614 and parameters 1616. Processes 1612 may be any suitable electronic design automation (EDA) tool or portion thereof used to design, simulate, analyze, and/or verify electronic circuitry and/or generate photomasks for electronic circuitry. Representation 1620 includes data that describes all or portions of system 100, controller 110, memory device 100, memory device 500, memory device 600, memory device 1300, memory device 1400, counter 1500, and their components, as shown in the Figures.

Representation 1620 may include one or more of behavioral, register transfer, logic component, transistor, and layout geometry-level descriptions. Moreover, representation 1620 may be stored on storage media or communicated by carrier waves.

Data formats in which representation 1620 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 1614 may comprise input parameters from a keyboard, mouse, voice recognition interface, microphone and speakers, graphical display, touch screen, or other type of user interface device. This user interface may be distributed among multiple interface devices. Parameters 1616 may include specifications and/or characteristics that are input to help define representation 1620. For example, parameters 1616 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 1604 includes any suitable type, number, and/or configuration of non-transitory computer-readable storage media that stores processes 1612, user inputs 1614, parameters 1616, and circuit component 1620.

Communications devices 1606 include any suitable type, number, and/or configuration of wired and/or wireless devices that transmit information from processing system 1600 to another processing or storage system (not shown) and/or receive information from another processing or storage system (not shown). For example, communications devices 1606 may transmit circuit component 1620 to another system. Communications devices 1606 may receive processes 1612, user inputs 1614, parameters 1616, and/or circuit component 1620 and cause processes 1612, user inputs 1614, parameters 1616, and/or circuit component 1620 to be stored in memory 1604.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A memory controller, comprising:
a first timing signal interface to transmit a first timing signal to a memory device having a memory core that determines a synchronous sampling of signals by the memory device at a first set of links;
a second timing signal interface to transmit a second timing signal that determines a synchronous sampling of signals by the memory device at a second set of links; and,
mode control circuitry to operate the memory device in a first mode where the memory device accesses the memory core in response to at least first command, first control, and first address information received via a first synchronous sampling of signals at the first set of links using the first timing signal, the mode control circuitry to also operate the memory device in a second mode where the memory device accesses the memory core in response to second command, second control, and second address information received via a first asynchronous sampling of signals at the first set of links and the first asynchronous sampling of signals at the second set of links using a third timing signal transmitted via a third timing signal interface.

2. The memory controller of claim 1, wherein the memory device is to activate a row in a bank of the memory core in response to the second command, second control, and second address information.

3. The memory controller of claim 1, wherein, when the memory device is operated in the first mode, information is to be communicated bidirectionally with the memory controller, synchronously, via the second set of links, using the second timing signal.

4. The memory controller of claim 1, wherein, when the memory device is operated in the second mode, information is to be communicated bidirectionally with the memory controller, synchronously, via the second set of links, using the second timing signal.

5. The memory controller of claim 1, wherein a first synchronous interface that samples the first set of links synchronously using the first timing signal when the memory device is operated in the first mode and a second synchronous interface that communicates synchronously with the second set of links using the second timing signal when the memory device is operated in the first mode are not to be sampling synchronously when the memory device is operated in the second mode.

6. The memory controller of claim 1, wherein, while the memory device is operated in the second mode and while the first timing signal interface is transmitting an inactive signal, at least one transition of the third timing signal initiates the first asynchronous sampling of the first set of links by the memory device to receive the second command, the second control, and the second address information.

7. The memory controller of claim 1, wherein a signal interface is to be used, when operating the memory device in the first mode, to receive a power control signal and is to be used, in the second mode, to transmit the third timing signal, where at least one transition of the third timing signal initiates the first asynchronous sampling of the first set of links by the memory device to receive the second command, the second control, and the second address information.

8. The memory controller of claim 6, wherein an exit from operating the memory device in the second mode to the first mode is to be initiated by activating the first timing signal.

9. The memory controller of claim 6, wherein the at least one transition of the third timing signal is to be detected by the memory device based on a sampling of the third timing signal using the first timing signal, a detected at least one transition of the third timing signal to initiate an exit from the memory device being operated in the second mode.

10. A memory controller, comprising:
a first interface to, when the memory controller is operating a memory device in a first mode, transmit command, address, and control signals synchronously with respect to a first timing reference transmitted by the memory controller, the memory device to activate a first row in response to the command, address, and control signals synchronously transmitted with respect to the first timing reference;
a second interface to, when the memory controller is operating the memory device in the first mode, bidirectionally communicate data with the memory device synchronously with respect to a second timing reference transmitted by the memory controller; and
the first interface and the second interface to, when the memory controller is operating the memory device in a second mode, transmit command, address, and control signals in conjunction with at least one transition of a third timing reference transmitted by the memory controller, the memory device to activate a second row in response to the command, address, and control signals transmitted in conjunction with the at least one transition of the third timing reference.

11. The memory controller of claim 10, wherein operating the memory device in the second mode is a lower power mode with respect to operating the memory device in the first mode.

12. The memory controller of claim 10, wherein, when the memory device is operated in the second mode, the second interface is to also communicate data synchronously with respect to the second timing reference.

13. The memory controller of claim 10, wherein, when operating the memory device in the second mode, the first interface is to transmit a portion of the command, address and control signals and the second interface is to transmit receive a remaining portion of the command, address and control signals in conjunction with the at least one transition of the third timing reference.

14. The memory controller of claim 13, wherein the remaining portion of the command, address and control signals comprises address signals.

15. The memory controller of claim 10, wherein, when the memory device is operated in the first mode, the first timing reference is active, the command, address, and control signals are enabled to be received by the memory device by an enable signal transmitted on a signal output.

16. The memory controller of claim 15, wherein, when the memory device is operated in the second mode and the first timing reference is inactive, the at least one transition of the third timing reference is to be transmitted via the signal output.

17. A memory controller, comprising:
control circuitry to operate a memory device in at least a first mode and a second mode;
a first synchronous timing reference interface to transmit a first timing reference signal, the first timing reference signal to be, when active, periodic at a first frequency;
a second synchronous timing reference interface to transmit a second timing reference signal, the second timing reference signal to be, when active, periodic at a second frequency;
a signal interface to transmit a timing signal;
a command/address interface to, when operating the memory device in the first mode transmit first information via the command/address interface synchronously with the first timing reference signal, the first information including address information sufficient to activate a first row of a first bank of a memory core of the memory device, the command/address interface to also, when operating the memory device in the second mode, transmit second information via the command/address interface asynchronously to first timing reference signal and the second timing reference signal, the second information to be transmitted from the command/address interface in conjunction with the timing signal; and,
a data interface to, when the memory device is operated in the second mode, transmit third information via the data interface asynchronously to the first timing reference signal and the second timing reference signal, the third information to be transmitted from the data interface in conjunction with the timing signal, the second information and the third information aggregately including address information sufficient to activate a second row of a second bank of the memory core of the memory device.

18. The memory controller of claim 17, wherein transmission of the second information and the third information is to initiate a self-timed activation of the second row of the second bank of the memory core of the memory device.

19. The memory controller of claim 18, wherein, when the memory device is operated in the first mode, the signal interface transmits a control signal that enables a memory device command/address interface to receive command/address information synchronously with respect to the first timing reference signal and enables a memory device data interface to communicate data synchronously with respect to the second timing reference signal.

20. The memory controller of claim 19, wherein during the self-timed activation, the second timing reference signal is to be activated and the data interface is to communicate data synchronously.

* * * * *